United States Patent
Nagai

(10) Patent No.: US 7,834,390 B2
(45) Date of Patent: Nov. 16, 2010

(54) NONVOLATILE SEMICONDUCTOR MEMORY DEVICE AND METHOD OF MANUFACTURING THE SAME

(75) Inventor: Takaaki Nagai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 104 days.

(21) Appl. No.: 12/320,893

(22) Filed: Feb. 6, 2009

(65) Prior Publication Data
US 2009/0200595 A1    Aug. 13, 2009

(30) Foreign Application Priority Data
Feb. 8, 2008    (JP)    ............... 2008-028580

(51) Int. Cl.
*H01L 29/423*    (2006.01)
*H01L 29/788*    (2006.01)

(52) U.S. Cl. .................. 257/319; 257/315; 257/316; 257/E29.03; 257/E29.129

(58) Field of Classification Search ............... 257/319, 257/316, 315, E29.129, E29.03
See application file for complete search history.

(56) References Cited

U.S. PATENT DOCUMENTS

| | | | |
|---|---|---|---|
| 7,489,006 B2* | 2/2009 | Watanabe et al. | 257/317 |
| 2005/0045966 A1* | 3/2005 | Yamashita et al. | 257/390 |
| 2008/0090355 A1* | 4/2008 | Chuang et al. | 438/266 |
| 2008/0099818 A1* | 5/2008 | Hung | 257/315 |
| 2008/0157163 A1* | 7/2008 | Park | 257/315 |
| 2009/0189211 A1* | 7/2009 | Orimoto et al. | 257/319 |

FOREIGN PATENT DOCUMENTS

| | | |
|---|---|---|
| JP | 2000-286348 A | 10/2000 |
| JP | 2001-085543 A | 3/2001 |
| JP | 2001-230330 A | 8/2001 |

OTHER PUBLICATIONS

U.S. Appl. No. 12/320,889, filed Feb. 6, 2009, NEC Electronics Corporation.
U.S. Appl. No. 12/320,890, filed Feb. 6, 2009, NEC Electronics Corporation.

* cited by examiner

*Primary Examiner*—Victor A Mandala
(74) *Attorney, Agent, or Firm*—Foley & Lardner LLP

(57) ABSTRACT

A nonvolatile semiconductor memory device has: a semiconductor substrate; a control gate and a floating gate that are formed side by side on a gate insulating film on a channel region in the semiconductor substrate; an erase gate facing an upper surface of the floating gate; a first device isolation structure having a first projecting portion; and a second device isolation structure having a second projecting portion. The first and second projecting portions have a first sloping surface and a second sloping surface, respectively. The first sloping surface and the second sloping surface face each other, and an interval between the first and second sloping surfaces becomes larger away from the semiconductor substrate. The floating gate is sandwiched between the first and second projecting portions and at least has a portion located on the semiconductor substrate side of the first and second sloping surfaces.

7 Claims, 48 Drawing Sheets

Fig. 27
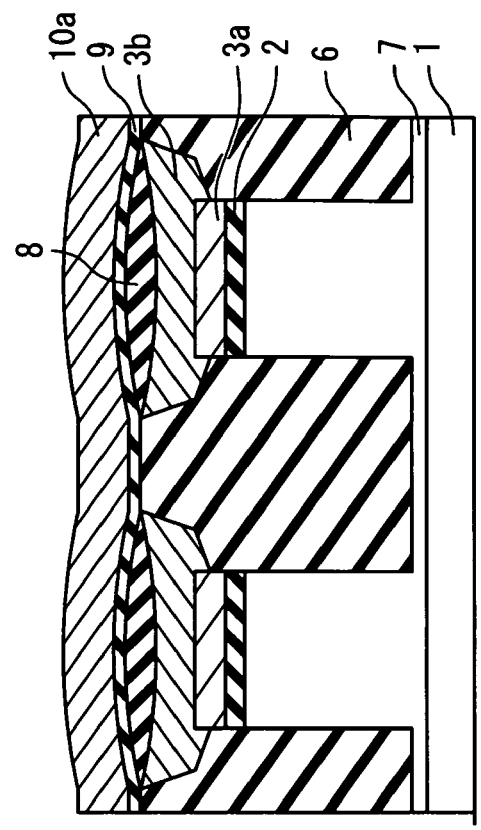
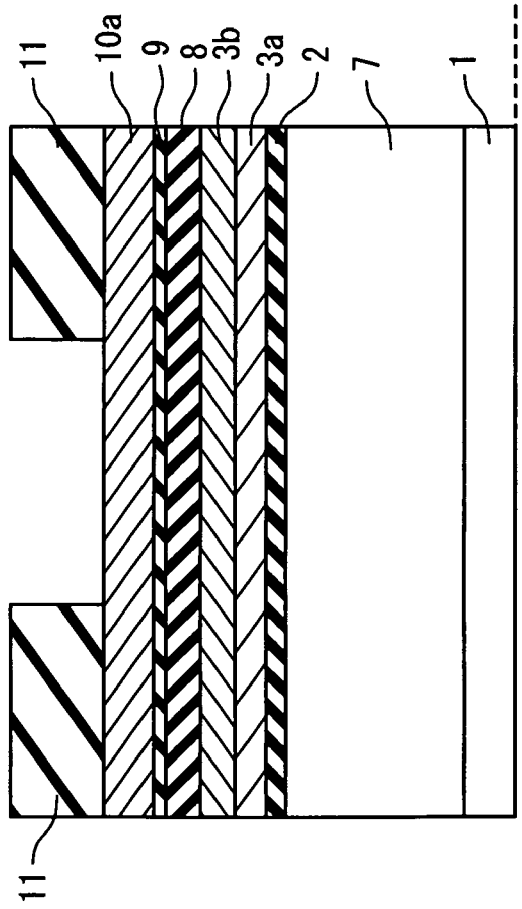

Fig. 28
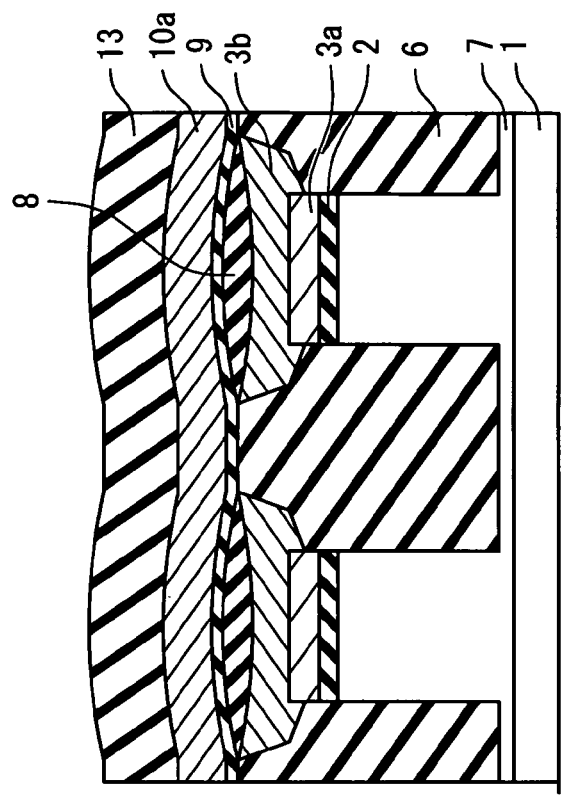
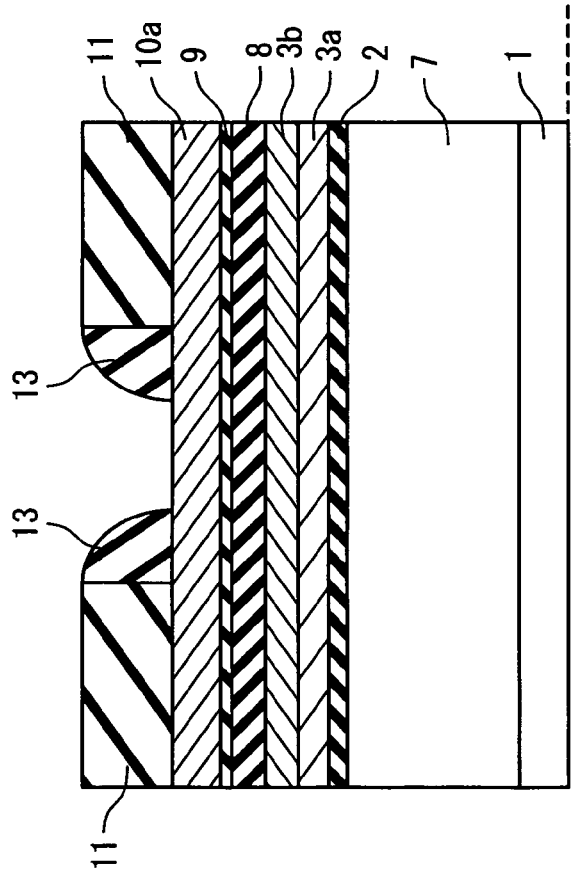

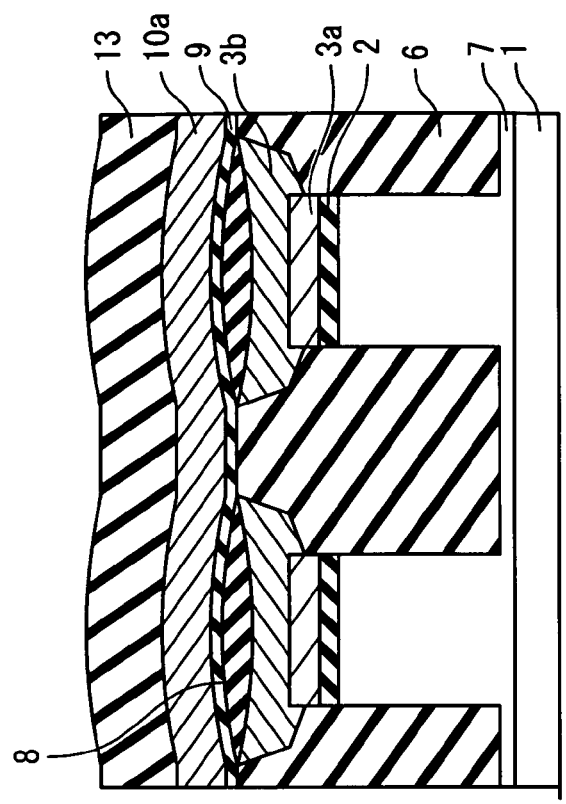
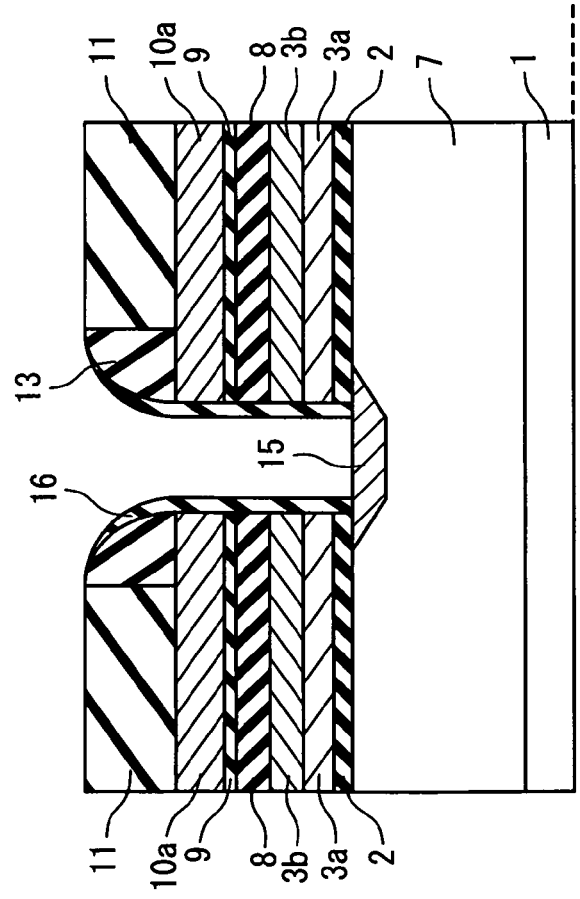
Fig. 31

NONVOLATILE SEMICONDUCTOR MEMORY DEVICE AND METHOD OF MANUFACTURING THE SAME

INCORPORATION BY REFERENCE

This application is based upon and claims the benefit of priority from Japanese patent application No. 2008-028580, filed on Feb. 8, 2008, the disclosure of which is incorporated herein in its entirely by reference.

BACKGROUND OF THE INVENTION

1. Field of the Invention

The present invention relates to a split gate-type nonvolatile semiconductor memory device and a method of manufacturing the same. In particular, the present invention relates to a split gate-type nonvolatile semiconductor memory device provided with an erase gate and a method of manufacturing the same.

2. Description of Related Art

Flash memories and EEPROMs are known as electrically erasable/programmable nonvolatile semiconductor memory devices. A memory cell of such a nonvolatile semiconductor memory device is typically a transistor provided with a floating gate and a control gate. The control gate may be stacked on the floating gate or may be formed on at least a channel region lateral to the floating gate. The latter one is generally referred to as a "split gate-type", which is excellent in terms of prevention of over-erasure and improvement in read speed.

Typical data programming/erasing methods with respect to the above-mentioned memory cell are as follows. The data programming is achieved by a CHE (Channel Hot Electron) method. More specifically, appropriate program potentials are respectively applied to the control gate and a drain, and thereby hot electrons generated in the vicinity of the drain are injected into the floating gate. On the other hand, the data erasing is achieved by an FN (Fowler-Nordheim) tunneling method. More specifically, a high potential is applied to the control gate, and electrons in the floating gate are extracted to the control gate through a tunnel insulating film due to the FN tunneling.

Here, the following problem can arise. In the case of the above-mentioned split gate-type, the control gate is formed on the channel region through a gate insulating film. Meanwhile, it is necessary at the time of data erasing to apply a high potential to the control gate in order to achieve the FN tunneling as mentioned above. Therefore, the gate insulating film immediately under the control gate to which the high potential is applied cannot be made thin, from a viewpoint of reliability. When the gate insulating film between the control gate and the channel region cannot be made thin, a read current at the time of data reading is reduced and thus the read speed is decreased.

As a technique proposed for solving such a problem, an "erase gate" for use in the data erasing is provided separately from the control gate (refer to Japanese Laid-Open Patent Application JP-2001-230330, Japanese Laid-Open Patent Application JP-2000-286348, Japanese Laid-Open Patent Application JP-2001-85543). At the time of data erasing, a high potential is applied not to the control gate but to the erase gate. As a result, electrons in the floating gate are extracted to the erase gate due to the FN tunneling. Since there is no need to apply a high potential to the control gate at the time of data erasing, it becomes possible to make the gate insulating film immediately under the control gate thin. Consequently, the decrease in the read speed can be prevented.

FIG. 1 shows a memory cell disclosed in Japanese Laid-Open Patent Application JP-2001-230330. A device isolation film 72 is formed on a silicon substrate 60 by a LOCOS (Local Oxidation of Silicon) method. A floating gate 64 is formed on the silicon substrate 60 through a gate oxide film 63. A selective oxide film 66 is formed on the floating gate 64 by a selective oxidation method. The selective oxide film 66 is made thick at the center of the floating gate 64, and consequently an upper surface of the floating gate 64 has a dent. Moreover, a tunnel oxide film 67 is so formed as to cover the device isolation film 72, side surfaces of the floating gate 64, and the selective oxide film 66. An erase gate 68 is formed on the tunnel oxide film 67, and an oxide film 69 is formed on the erase gate 68. As shown in FIG. 1, the erase gate 68 faces the upper surface of the floating gate 64 across the selective oxide film 66 and the tunnel oxide film 67, and further faces the side surfaces of the floating gate 64 across the tunnel oxide film 67. The side surfaces of the floating gate 64 are vertical.

FIG. 2 shows a memory cell disclosed in Japanese Laid-Open Patent Application JP-2000-286348. A source region 81 and a drain region 82 are formed in a silicon substrate 80. A floating gate 84 and a control gate 85 are formed on the silicon substrate 80 through a gate oxide film 83. Furthermore, an erase gate 86 is formed on the source region 81 through the gate oxide film 83 and a tunnel oxide film 87. The tunnel oxide film 87 is also formed between the floating gate 84 and the erase gate 86, and an oxide film 88 is formed between the floating gate 84 and the control gate 85. Silicide films 89, 90 and 91 are formed on upper surfaces of the drain region 82, the control gate 85 and the erase gate 86, respectively. As shown in FIG. 2, the erase gate 86, which is formed over the source region 81, faces a part of a upper surface and the whole of side surfaces of the floating gate 84 across the tunnel oxide film 87. The side surfaces of the floating gate 84 are vertical.

FIG. 3 shows a memory cell disclosed in Japanese Laid-Open Patent Application JP-2001-85543. A source region 101 and a drain region 102 are formed in a silicon substrate 100. A control gate 105 and a floating gate 106 are formed on a channel region through gate insulating films 103 and 104, respectively. An oxide film 109 is formed on the control gate 105. A source interconnection 110 is formed on the source region 101. Furthermore, a tunnel oxide film 108 is so formed as to cover the floating gate 106, the oxide film 109 and the source interconnection 110. An erase gate 107 is formed on the tunnel oxide film 108. As shown in FIG. 3, the floating gate 106 has a first side surface that is vertical and a second side surface that is curved. The first side surface and the second side surface are connected with each other at a top edge portion of the floating gate 106, and an interval between the first side surface and the second side surface becomes larger from the top edge portion towards the silicon substrate 100. In other words, the floating gate 106 is sharp towards the top edge portion. The erase gate 107 faces the top edge portion of the floating gate 106 across the tunnel oxide film 108.

The inventor of the present application has recognized the following points. In order to improve an erase efficiency, an electric field concentration at an acute-angled portion of the floating gate facing the erase gate may be utilized. The inventor has considered that the acute-angle portion of the floating gate facing the erase gate can be formed by incurving both side surfaces of the floating gate. Such a floating gate whose both side surfaces are incurved can be fabricated as follows for example.

As shown in FIG. 50, a gate insulating film 2 is formed on a semiconductor substrate 1, and device isolation structures 6-1 and 6-2 projecting from the semiconductor substrate 1 are formed. The device isolation structure 6-1 has a first projecting portion PR1 that projects from the semiconductor substrate 1, and the device isolation structure 6-2 has a second projecting portion PR2 that projects from the semiconductor substrate 1. By removing respective upper edge portions of the first projecting portion PR1 and the second projecting portion PR2 through an etching, a first sloping surface SLP1 and a second sloping surface SLP2 are respectively formed on the first projecting portion PR1 and the second projecting portion PR2, as shown in FIG. 50. The first sloping surface SLP1 and the second sloping surface SLP2 face each other, and an interval between the first sloping surface SLP1 and the second sloping surface SLP2 becomes larger away from the semiconductor substrate 1. Then, a floating gate is so formed as to be sandwiched between the first projecting portion PR1 and the second projecting portion PR2. Since both side surfaces of the floating gate thus formed are respectively in contact with the first sloping surface SLP1 and the second sloping surface SLP2, the both side surfaces are incurved.

However, in the case where the first sloping surface SLP1 and the second sloping surface SLP2 are formed by the etching, the following problem can arise. That is, if the upper edge portions of the first projecting portion PR1 and the second projecting portion PR2 are over-etched, the semiconductor substrate 1 is exposed as shown in FIG. 50 and a so-called "divot" occurs. The divot remarkably deteriorates reliability of the device. In order to secure the reliability of the device, it is desirable to suitably form the acute-angled portion of the floating gate without generating the divot.

SUMMARY

In one embodiment of the present invention, a nonvolatile semiconductor memory device is provided. The nonvolatile semiconductor memory device comprises: a semiconductor substrate; a control gate and a floating gate that are formed side by side on a gate insulating film on a channel region in the semiconductor substrate; an erase gate facing an upper surface of the floating gate; a first device isolation structure having a first projecting portion that projects from the semiconductor substrate; and a second device isolation structure having a second projecting portion that projects from the semiconductor substrate. The first projecting portion has a first sloping surface connecting between an upper surface and a side surface of the first device isolation structure, and the second projecting portion has a second sloping surface connecting between an upper surface and a side surface of the second device isolation structure. The first sloping surface and the second sloping surface face each other, and an interval between the first sloping surface and the second sloping surface becomes larger away from the semiconductor substrate. The floating gate is sandwiched between the first projecting portion and the second projecting portion, and at least has a portion located on the semiconductor substrate side of the first sloping surface and the second sloping surface.

In another embodiment of the present invention, a nonvolatile semiconductor memory device is provided. The nonvolatile semiconductor memory device comprises: a semiconductor substrate; a device isolation structure having a projecting portion that projects from the semiconductor substrate; a control gate and a floating gate that are formed side by side on a gate insulating film on a channel region in the semiconductor substrate; and an erase gate facing an upper surface of the floating gate. The projecting portion has a sloping surface connecting between an upper surface and a side surface of the device isolation structure. A side surface of the floating gate is in contact with the sloping surface. A width of a bottom surface of the floating gate is smaller than a width of the upper surface of the floating gate. The floating gate at least has a portion located on the semiconductor substrate side of the sloping surface.

In still another embodiment of the present invention, a method of manufacturing a nonvolatile semiconductor memory device is provided. First, a first gate material film is formed on a first gate insulating film on a semiconductor substrate. Next, a first device isolation structure and a second device isolation structure are so formed as to penetrate through the first gate material film and the first gate insulating film to protrude into the semiconductor substrate. The first device isolation structure and the second device isolation structure respectively have a first projecting portion and a second projecting portion that project from a semiconductor substrate. Next, respective upper edge portions of the first projecting portion and the second projecting portion are etched. As a result, a first sloping surface connecting between an upper surface and a side surface of the first device isolation structure is formed, and a second sloping surface connecting between an upper surface and a side surface of the second device isolation structure is formed. Here, the first sloping surface and the second sloping surface face each other, and an interval between the first sloping surface and the second sloping surface becomes larger away from the semiconductor substrate. Also, the first gate material film at least has a portion located on the semiconductor substrate side of the first sloping surface and the second sloping surface. Next, a second gate material film sandwiched between the first sloping surface and the second sloping surface is formed on the first gate material film. Next, a floating gate sandwiched between the first projecting portion and the second projecting portion is formed by patterning the first gate material film and the second gate material film. An upper surface of the floating gate faces an erase gate. Next, a control gate next to the floating gate is formed on a second gate insulating film on the semiconductor substrate.

According to the present invention, the acute-angled portion of the floating gate facing the erase gate can be formed suitably without generating the divot. As a result, it is possible to improve an erase efficiency and an erase speed without deteriorating reliability of the device.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 11 to 49 are cross-sectional views showing a manufacturing process of a nonvolatile semiconductor memory device according to the present embodiment.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Summary

Figure 1:
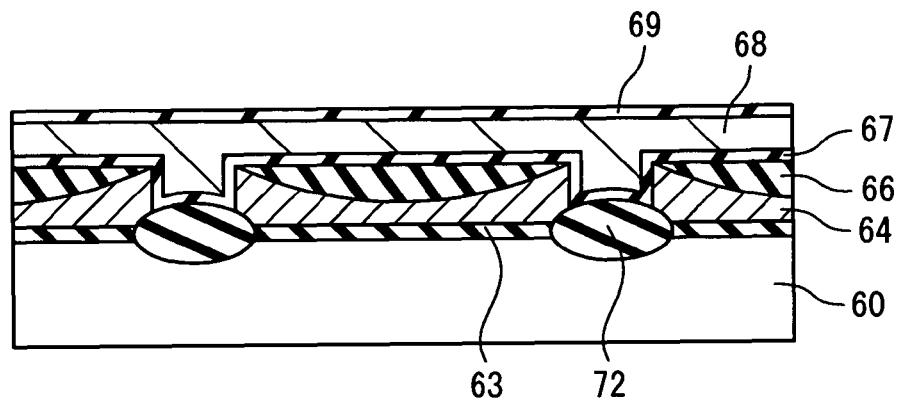
FIG. 1 is a cross-sectional view showing a memory cell according to a related technique.
Figure 2:
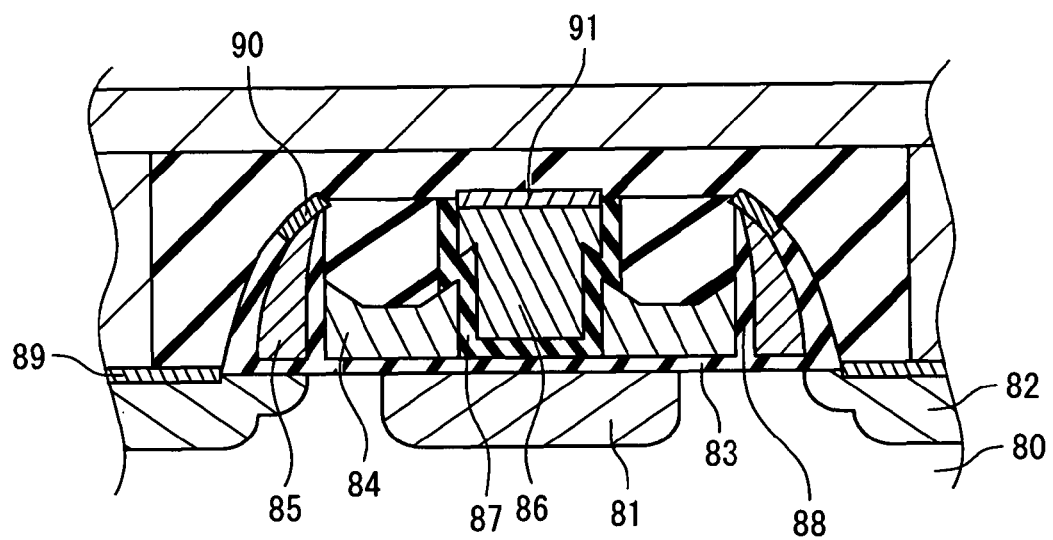
FIG. 2 is a cross-sectional view showing a memory cell according to another related technique.
Figure 3:
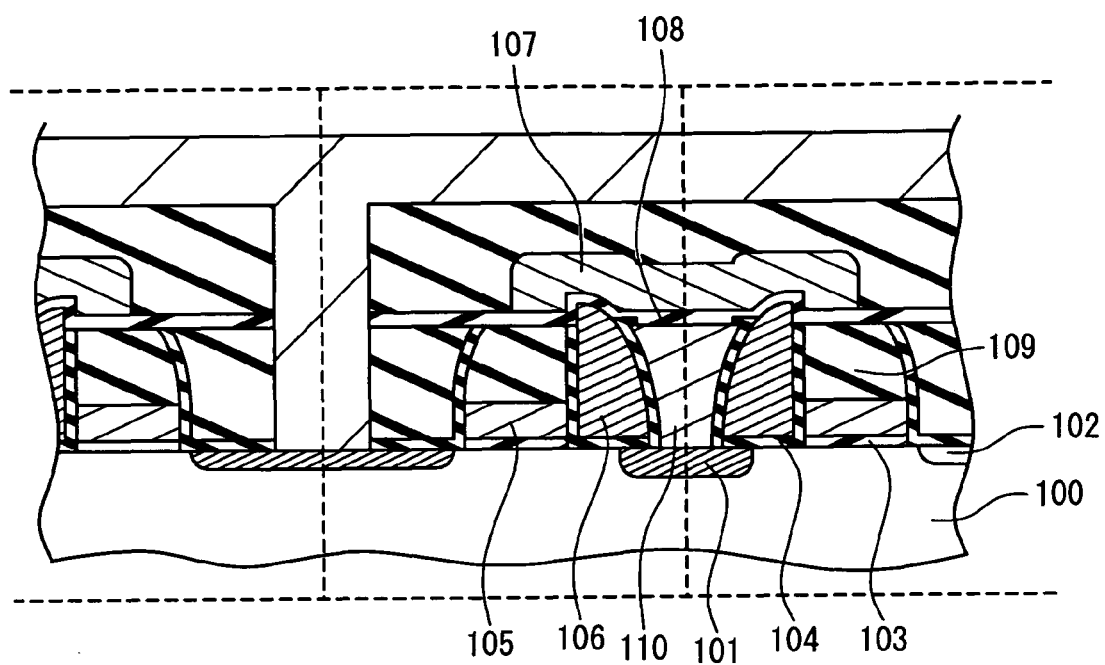
FIG. 3 is a cross-sectional view showing a memory cell according to another conventional technique.
Figure 4:
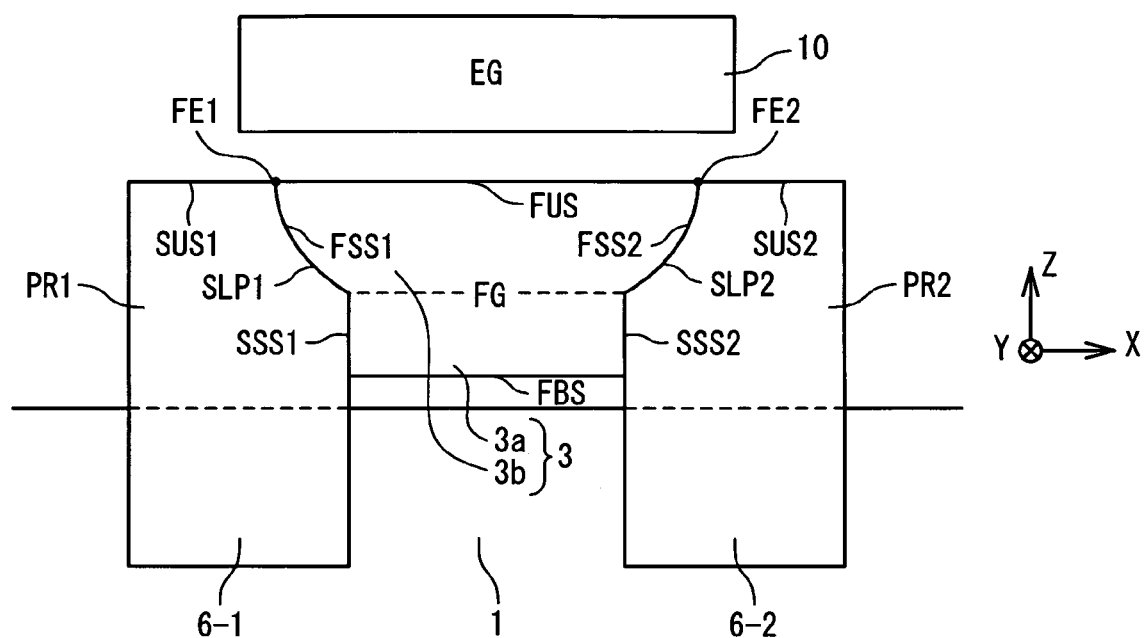
FIG. 4 schematically shows a memory cell according to an embodiment of the present invention.

FIG. 4 schematically shows a memory cell of a nonvolatile semiconductor memory device according to an embodiment of the present invention. A floating gate 3 is formed on a semiconductor substrate 1 through a gate insulating film. Also, an erase gate 10 is so formed as to face an upper surface FUS of the floating gate 3.

A first device isolation structure 6-1 and a second device isolation structure 6-2 are formed on the semiconductor substrate 1. The first device isolation structure 6-1 has a first projecting portion PR1 that projects from the semiconductor substrate 1, and the second device isolation structure 6-2 has a second projecting portion PR2 that projects from the semiconductor substrate 1. The first projecting portion PR1 has a first sloping surface SLP1 that connects between an upper surface SUS1 and a side surface SSS1 of the first device isolation structure 6-1. Meanwhile, the second projecting portion PR2 has a second sloping surface SLP2 that connects between an upper surface SUS2 and a side surface SSS2 of the second device isolation structure 6-2. The first sloping surface SLP1 and the second sloping surface SLP2 face each other, and an interval between the first sloping surface SLP1 and the second sloping surface SLP2 becomes larger away from the semiconductor substrate 1.

Side surfaces of the floating gate 3 include a first side surface FSS1 and a second side surface FSS2 that face each other. Moreover, the upper surface FUS of the floating gate 3 includes a first side FE1 and a second side FE2 that face each other. The upper surface FUS of the floating gate 3 is connected to the first side surface FSS1 at the first side FE1 and to the second side surface FSS2 at the second side FE2. According to the present embodiment, the floating gate 3 is sandwiched between the first projecting portion PR1 and the second projecting portion PR2. More specifically, the first side surface FSS1 and the second side surface FSS2 of the floating gate 3 are in contact with the above-mentioned first sloping surface SLP1 and second sloping surface SLP2, respectively. Therefore, an interval between the first side surface FSS1 and the second side surface FSS2 becomes narrower from the upper surface FUS towards the side of the semiconductor substrate 1. That is, both side surfaces FSS1 and FSS2 of the floating gate 3 are incurved.

Moreover, in the present embodiment, the floating gate 3 at least has a portion that is located on the semiconductor substrate side of the above-mentioned first sloping surface SLP1 and second sloping surface SLP2. More specifically, as shown in FIG. 4, the floating gate 3 includes a first conductive film 3a formed on the semiconductor substrate 1 through the gate insulating film and a second conductive film 3b formed on the first conductive film 3a. A bottom surface FBS of the first conductive film 3a is located on the semiconductor substrate side of the first sloping surface SLP1 and the second sloping surface SLP2. In other words, at least a part of the first conductive film 3a is located below the first sloping surface SLP1 and the second sloping surface SLP2.

Figure 50:
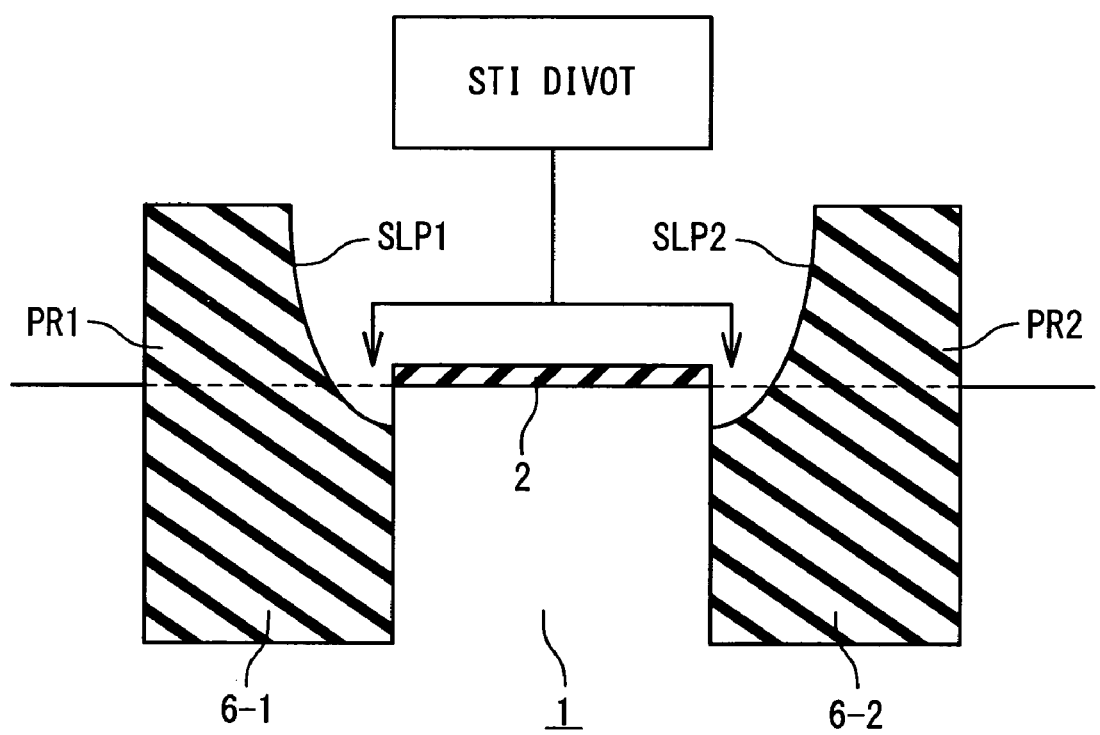
FIG. 50 is a schematic diagram for explaining occurrence of an STI divot.

As described later, the first sloping surface SLP1 and the second sloping surface SLP2 are formed by etching respective upper edge portions of the first projecting portion PR1 and the second projecting portion PR2. The above-mentioned first conductive film 3a of the floating gate 3 is formed prior to the etching process and plays a role of protecting the semiconductor substrate 1 in the etching process. Consequently, the occurrence of divot as shown in FIG. 50 can be prevented. That is to say, it is possible to suitably form the first sloping surface SLP1 and the second sloping surface SLP2 without generating the divot and to form the floating gate whose both side surfaces FSS1 and FSS2 are curved.

At a time of data erasing, electrons in the floating gate 3 are extracted from the floating gate 3 to the erase gate 10. As described above, the interval between the first side surface FSS1 and the second side surface FSS2 of the floating gate 3 becomes narrower from the upper surface FUS towards the semiconductor substrate side. Therefore, both edge portions (FE1, FE2) of the upper surface FUS of the floating gate 3, which face the erase gate 10, become sharper. Thus, the electric field concentration at the edge portions (FE1, FE2) of the upper surface FUS of the floating gate 3 is intensified, and consequently an erase efficiency and an erase speed are improved.

According to the present embodiment, as described above, the acute-angled portions (FE1, FE2) of the floating gate 3 facing the erase gate 10 can be formed suitably without generating the divot. As a result, it is possible to improve the erase efficiency and the erase speed without deteriorating reliability of the device.

2. Structure Example

Figure 5:
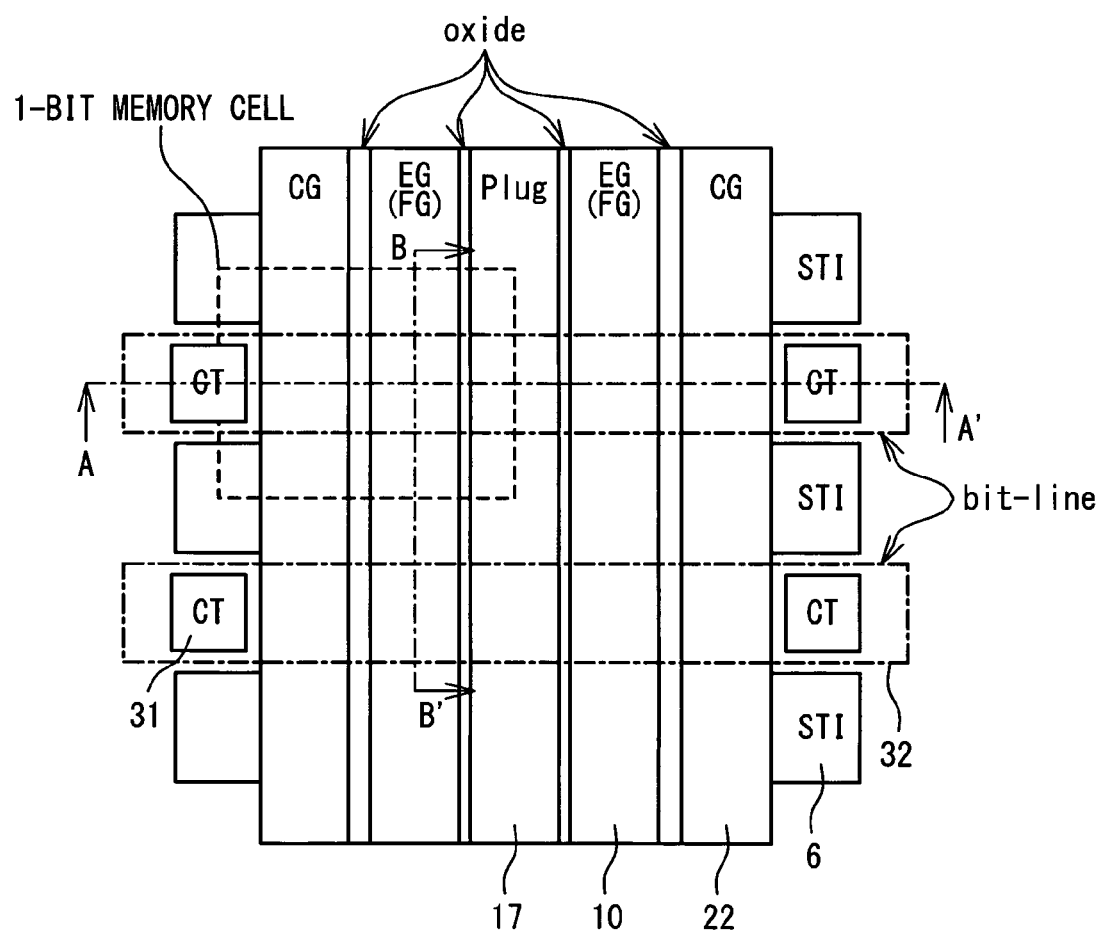
FIG. 5 is a plan view showing an example of a nonvolatile semiconductor memory device according to an embodiment of the present invention.
Figure 6A:
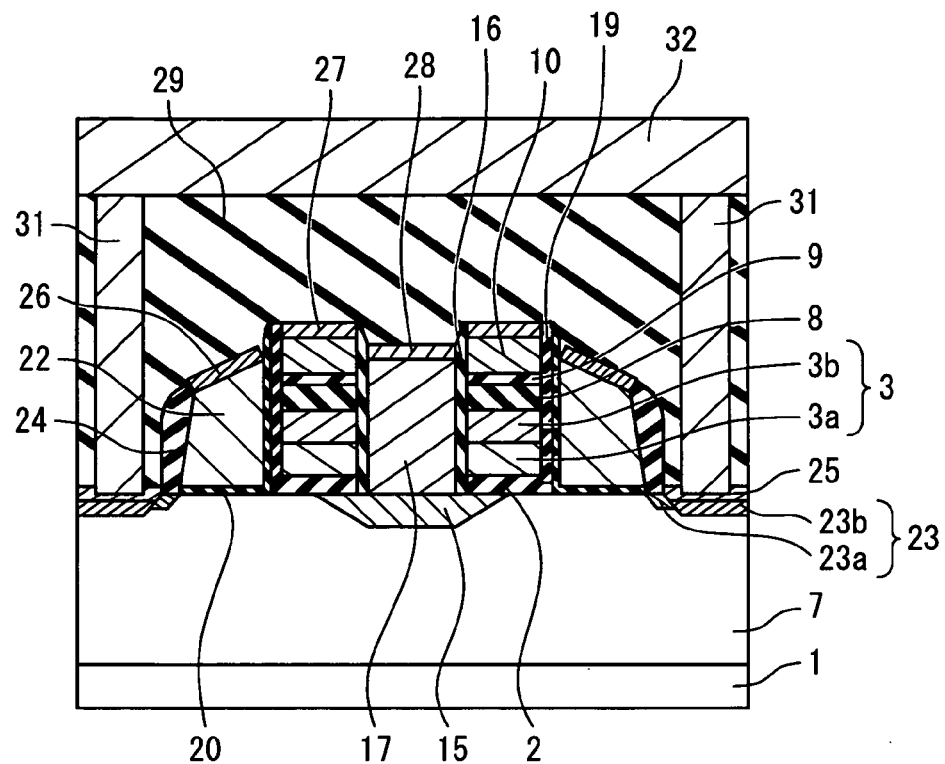
FIG. 6A shows a cross-sectional structure along a line A-A' in FIG. 5.
Figure 6B:
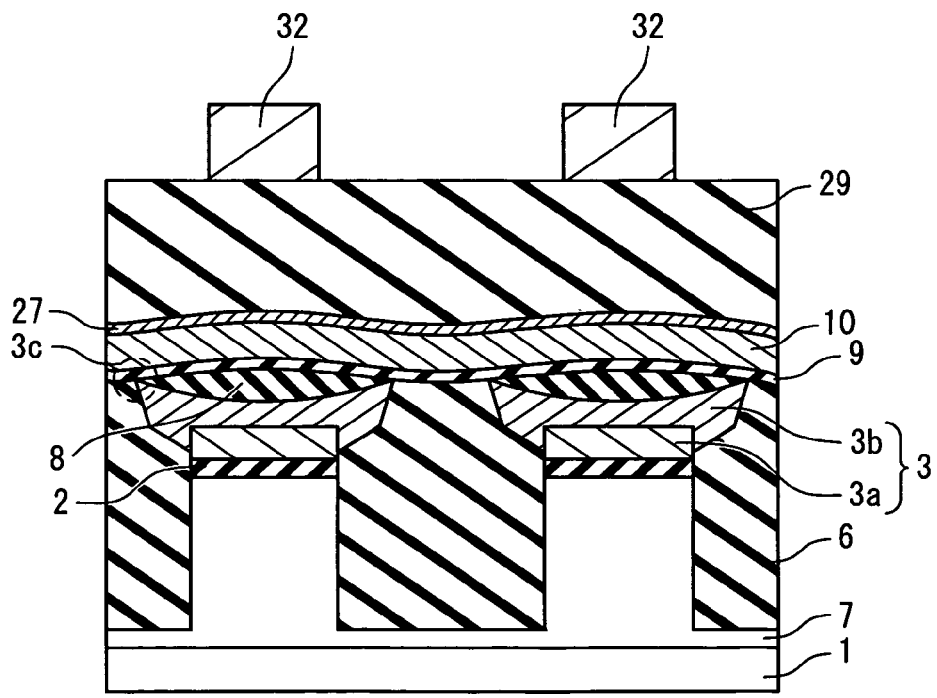
FIG. 6B shows a cross-sectional structure along a line B-B' in FIG. 5.

An example of the nonvolatile semiconductor memory device according to the present embodiment will be described below in detail. FIG. 5 is a plan view (planar layout) of the nonvolatile semiconductor memory device according to the present example. FIGS. 6A and 6B respectively show cross-sectional structures along lines A-A' and B-B' in FIG. 5.

In FIG. 5, a region surrounded by a broken line corresponds to a memory cell of 1 bit. An erase gate (EG) 10, a control gate (CG) 22 and a plug (PLUG) 17 are formed in a direction parallel to the line B-B'. The erase gate 10 and the control gate 22 are arranged symmetrically on both sides of the plug 17. The plug 17, the erase gate 10 and the control gate 22 extend in the B-B' direction and are shared by memory cells arranged along the B-B' direction. On the other hand, an STI (Shallow Trench Isolation) 6 as a device isolation structure and a metal interconnection layer (bit-line) 32 are formed in a direction parallel to the line A-A'. The metal interconnection layer 32 is connected with a contact plug (CT) 31 connected to the memory cell and is formed above the plug 17, the erase gate 10 and the control gate 22. Moreover, each memory cell has a floating gate (FG) 3. In each memory cell, the floating gate 3 is formed below the erase gate 10 and is sandwiched between adjacent STIs 6.

FIG. 6A shows a cross-sectional structure of two memory cells along the line A-A' in FIG. 5. A P-well 7 is formed in a silicon substrate 1 as a semiconductor substrate. A first source/drain diffusion layer 15 and a second source/drain diffusion layer 23, each of which is an N-type impurity region and can be a source or a drain, are formed at a surface of the P-well 7. The second source/drain diffusion layer 23 has an LDD structure. The plug 17 is formed on the first source/drain diffusion layer 15 and is electrically connected to the first source/drain diffusion layer 15. A cobalt silicide film 28 is formed on an upper surface of the plug 17. Meanwhile, the contact plug 31 is formed on the second source/drain diffusion layer 23. A cobalt silicide film 25 is formed on a surface (upper surface) of the second source/drain diffusion layer 23, and the contact plug 31 is electrically connected to the second source/drain diffusion layer 23 through the cobalt silicide film 25. The metal interconnection layer 32 connected to the contact plug 31 is formed on an interlayer insulating film 29.

The floating gate 3 is formed on either side of the plug 17 across a second oxide film sidewall spacer 16. The floating gate 3 has a two-layer structure including a first polysilicon film (first conductive film) 3a and a second polysilicon film (second conductive film) 3b. A first gate oxide film 2 is formed between the floating gate 3 and the silicon substrate 1 (P-well 7). The floating gate 3 partially overlaps the first source/drain diffusion layer 15 and is capacitive-coupled to the first source/drain diffusion layer 15 through the first gate oxide film 2. Moreover, a third oxide film sidewall spacer 19 and a second gate oxide film 20 are formed on a side surface of the floating gate 3 on the opposite side of the second oxide film sidewall spacer 16. Furthermore, an oxide film 8 and a tunnel oxide film 9 are formed on the floating gate 3. In this manner, the floating gate 3 is surrounded by the insulating films and is electrically isolated from the outside.

The erase gate 10 is formed on the floating gate 3 through the oxide film 8 and the tunnel oxide film 9. As in the case of the floating gate 3, the second oxide film sidewall spacer 16, the third oxide film sidewall spacer 19 and the second gate oxide film 20 are formed on side surfaces of the erase gate 10. An upper surface of the erase gate 10 is silicided and a cobalt silicide film 27 is formed thereon. As described later, the erase gate 10 is used at the time of data erasing.

Furthermore, the control gate 22 is formed on a channel region at the surface of the silicon substrate 1 (P-well 7) through the second gate oxide film 20. That is to say, the control gate 22 and the floating gate 3 are formed side by side on the gate oxide films (2, 20) on the channel region. This is a feature of the split gate-type memory cell. The third oxide film sidewall spacer 19 and the second gate oxide film 20 are formed between the control gate 22 and the floating gate 3. A fourth oxide film sidewall spacer 24 is formed on the other side surface of the control gate 22. An upper surface of the control gate 22 is silicided and a cobalt silicide film 26 is formed thereon.

As described above, the upper surfaces of the second source/drain diffusion layer 23, the control gate 22, the erase gate 10 and the plug 17 all are silicided. As a result, interconnection resistance can be sufficiently reduced.

As shown in FIG. 6A, adjacent memory cells share the first source/drain diffusion layer 15 (plug 17). The respective memory cells are formed symmetrical to the first source/drain diffusion layer 15 (plug 17). That is, the floating gate 3, the erase gate 10, the control gate 22 and the like are formed symmetrically with respect to the first source/drain diffusion layer 15 (plug 17).

FIG. 6B shows cross-sectional structures of two memory cells along the line B-B' in FIG. 5. The STI 6 as the device isolation structure is formed in the silicon substrate 1 (P-well 7) and also projects from the silicon substrate 1 (P-well 7). Upper edge portions of each STI 6 are etched and hence sloping surfaces are formed on each STI 6.

The floating gate 3 is formed on the silicon substrate 1 (P-well 7) between adjacent STIs 6 through the first gate oxide film 2. The floating gate 3 is sandwiched between the two adjacent STIs 6. The floating gate 3 has a two-layer structure including the first polysilicon film (first conductive film) 3a and the second polysilicon film (second conductive film) 3b. The second polysilicon film 3b among them is so formed as to partially overlap the STI 6. Moreover, an upper surface of the second polysilicon film 3b is so formed as to sag downward in the center, and both side surfaces of the second polysilicon film 3b are so formed as to incurve. Consequently, a sharp acute-angled portion 3c hanging over the STI 6 is formed at an upper corner of the second polysilicon film 3b. An angle formed by the acute-angled portion 3c is about 30 to 40 degrees, for example.

The oxide film 8 is formed on the upper surface of the floating gate 3. The oxide film 8 is thickest on the center portion of the floating gate 3 and becomes thinner towards its edge portions. The tunnel oxide film 9 is so formed as to cover the oxide film 8, the acute-angled portion 3c of the floating gate 3 and the STI 6. That is to say, the acute-angled portion 3c on the upper surface of the floating gate 3 is in contact with the tunnel oxide film 9.

The erase gate 10 is formed on the tunnel oxide film 9. The erase gate 10 faces the upper surface of the floating gate 3. Here, a distance between the floating gate 3 and the erase gate 10 is smallest at the acute-angled portion 3c of the floating gate 3, where the smallest distance is almost equal to a thickness of the tunnel oxide film 9. That is to say, the erase gate 10 particularly faces the acute-angled portion 3c of the floating gate 3 across the tunnel oxide film 9.

The cobalt silicide film 27 is formed on the erase gate 10. The interlayer insulating film 29 is formed on the cobalt silicide film 27.

Figure 7:
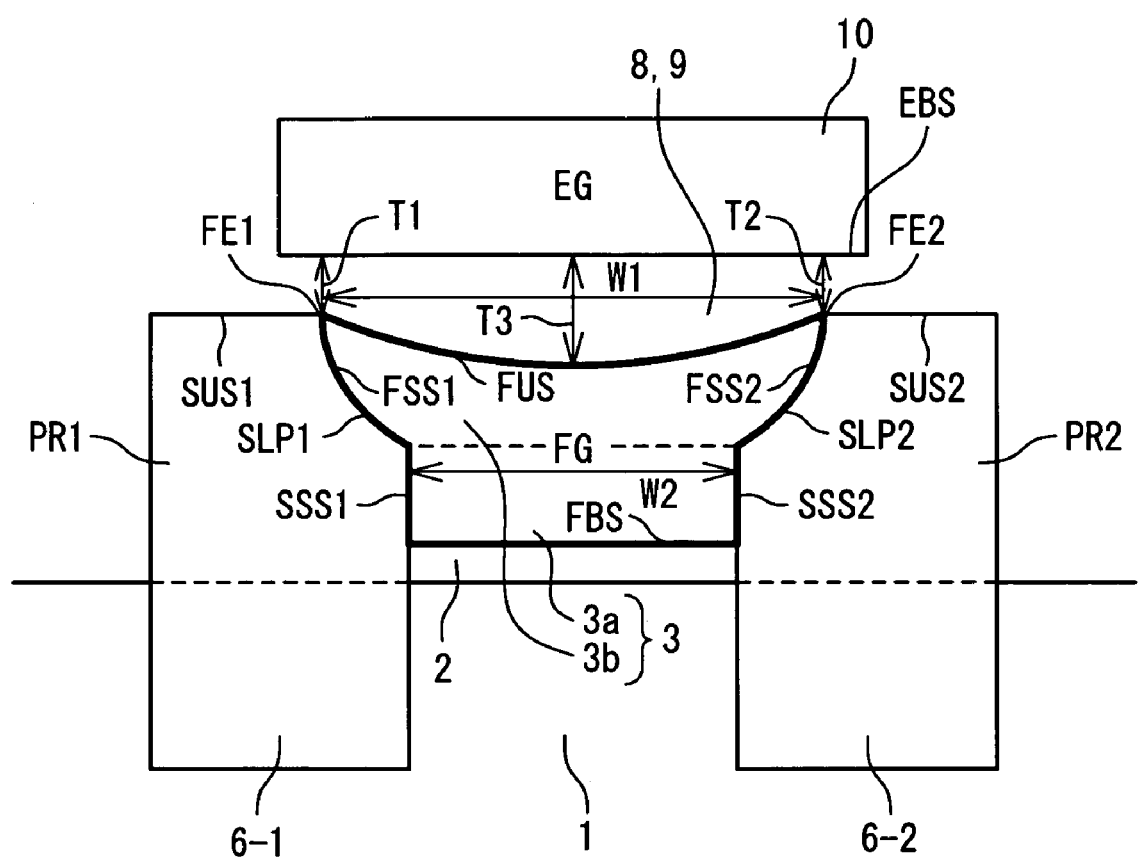
FIG. 7 schematically shows the structure of a memory cell shown in FIG. 6B.

FIG. 7 schematically shows the structure of the memory cell shown in FIG. 6B. Referring to FIG. 7, shapes and positional relationship of the floating gate 3, the device isolation structure (STI) 6 and the erase gate 10 in the present example will be described in more detail.

A first device isolation structure 6-1 and a second device isolation structure 6-2 are formed on the silicon substrate 1. The first device isolation structure 6-1 and the second device isolation structure 6-2 are parallel to each other (see also FIG. 5). The first device isolation structure 6-1 has a first projecting portion PR1 that projects from the silicon substrate 1, and the second device isolation structure 6-2 has a second projecting portion PR2 that projects from the silicon substrate 1. The first projecting portion PR1 has a first sloping surface SLP1 that is curved and connects between an upper surface SUS1 and a side surface SSS1 of the first device isolation structure 6-1. Meanwhile, the second projecting portion PR2 has a second sloping surface SLP2 that is curved and connects between an upper surface SUS2 and a side surface SSS2 of the second device isolation structure 6-2. The first sloping surface SLP1 and the second sloping surface SLP2 face each other, and an interval between the first sloping surface SLP1 and the second sloping surface SLP2 becomes larger away from the silicon substrate 1.

The floating gate 3 is formed on the silicon substrate 1 through the first gate oxide film 2. Side surfaces of the floating gate 3 include a first side surface FSS1 and a second side surface FSS2 that face each other. Moreover, an upper surface FUS of the floating gate 3 includes a first side FE1 and a second side FE2 that face each other. The upper surface FUS of the floating gate 3 is connected to the first side surface FSS1 at the first side FEE and to the second side surface FSS2 at the second side FE2.

The upper surface FUS of the floating gate 3 is curved and has a dent. The first side FE1 and the second side FE2 are located above the upper surface FUS between the first side FE1 and the second side FE2. That is, the floating gate 3 has the above-mentioned "acute-angled portions $3c$" at the first side FEE and the second side FE2 of the upper surface FUS. Note that the number of the acute-angled portions $3c$ is not limited to two and can be one or three or more.

Moreover, the floating gate 3 is sandwiched between the first projecting portion PR1 and the second projecting portion PR2. More specifically, the first side surface FSS1 and the second side surface FSS2 of the floating gate 3 are in contact with the above-mentioned first sloping surface SLP1 and second sloping surface SLP2, respectively. Therefore, an interval between the first side surface FSS1 and the second side surface FSS2 becomes smaller from the upper surface FUS towards the silicon substrate 1. That is, both side surfaces FSS1 and FSS2 of the floating gate 3 are incurved. As a result, a width W2 of a bottom surface FBS of the floating gate 3 is narrower than a width W1 of the upper surface FUS. In addition, the "acute-angled portions $3c$" at the first side FE1 and the second side FE2 of the upper surface FUS become sharper.

The floating gate 3 at least has a portion that is located on the substrate side of the above-mentioned first sloping surface SLP1 and second sloping surface SLP2. More specifically, the floating gate 3 includes a first conductive film $3a$ formed on the silicon substrate 1 through the first gate oxide film 2 and a second conductive film $3b$ formed on the first conductive film $3a$. A bottom surface FBS of the first conductive film $3a$ is located on the silicon substrate side of the first sloping surface SLP1 and the second sloping surface SLP2. In other words, at least a part of the first conductive film $3a$ is located below the first sloping surface SLP1 and the second sloping surface SLP2.

The erase gate 10 is so formed as to face the upper surface FUS of the floating gate 3. Here, the whole of the erase gate 10 is located above the upper surface FUS of the floating gate 3, namely, the erase gate 10 is totally located above the upper surface FUS of the floating gate 3. Accordingly, the erase gate 10 does not face a side surface of the floating gate 3. Intervals between a bottom surface EBS of the erase gate 10 and the first side FEE and the second side FE2 of the floating gate 3 are T1 and T2, respectively. An interval between the bottom surface EBS of the erase gate 10 and the upper surface FUS between the sides FE1 and FE2 is T3 which is larger than the above-mentioned T1 and T2 (T3>T1, T2). That is to say, the bottom surface EBS of the erase gate 10 is closer to the first side FE1 and the second side FE2 than the upper surface FUS between the first side FE1 and the second side FE2 of the floating gate 3.

It should be noted that the features described above include the features described with reference to the foregoing FIG. 4.

3. Operation

Next, data programming, data reading and data erasing with respect to the memory cell according to the present embodiment will be described.

(Data Programming)

Figure 8:
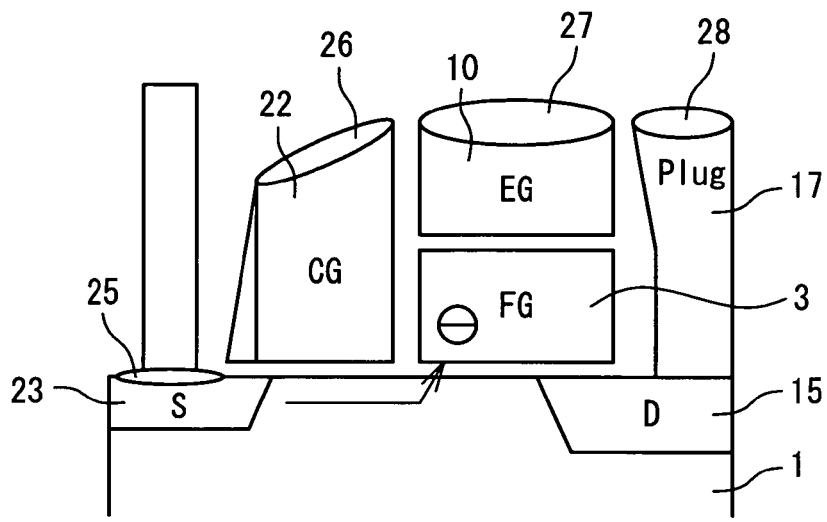
FIG. 8 is a conceptual view showing data programming in the present embodiment.

Referring to FIG. 8, the data programming will be described. FIG. 8 conceptually shows a structure along the line A-A'. The programming is performed by a source-side CHE (Channel Hot Electron) injection. In the programming operation, the first source/drain diffusion layer 15 serves as a drain (D), while the second source/drain diffusion layer 23 serves as a source (S). For example, a voltage of +1.6 V is applied to the control gate 22, a voltage of +7.6 V is applied to the first source/drain diffusion layer 15, and a voltage of +0.3 V is applied to the second source/drain diffusion layer 23. Electrons emitted from the second source/drain diffusion layer 23 are accelerated by an intense electric field at the channel region to be CHEs. In particular, a potential of the floating gate 3 is high due to capacitive coupling between the first source/drain diffusion layer 15 and the floating gate 3, and thus an intense electric field is generated at a narrow gap between the control gate 22 and the floating gate 3. The high-energy CHEs generated due to the intense electric field are injected into the floating gate 3 through the gate oxide film 2. Such injection is called a source-side injection (SSI). According to the SSI, an electron injection efficiency is improved and hence the application voltage can be set low. Since the electrons are injected into the floating gate 3, a threshold voltage of the memory cell transistor is increased.

In the programming operation, an appropriate voltage (e.g. 4 to 5 V) may also be applied to the erase gate 10. That is, the erase gate 10 can play a role of raising the potential of the floating gate 3. In this case, it is possible to lower the voltage applied to the first source/drain diffusion layer 15 and thus to improve a punch-through resistance between the first source/drain diffusion layer 15 and the second source/drain diffusion layer 23 (between the source and the drain).

(Data Reading)

Figure 9:
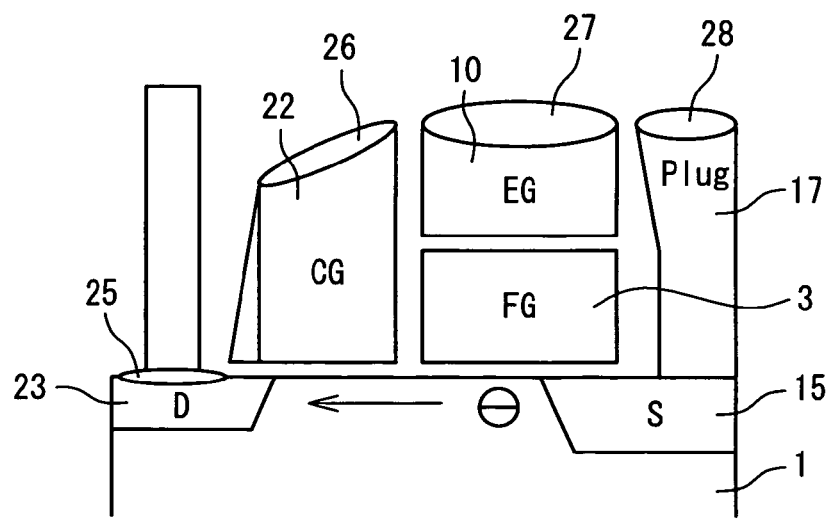
FIG. 9 is a conceptual view showing data reading in the present embodiment.

Referring to FIG. 9, the data reading will be described. FIG. 9 conceptually shows a structure along the line A-A'. In the reading operation, the first source/drain diffusion layer 15 serves as a source (S), while the second source/drain diffusion layer 23 serves as a drain (D). For example, a voltage of +2.7 V is applied to the control gate 22, a voltage of +0.5 V is applied to the second source/drain diffusion layer 23, and voltages of the first source/drain diffusion layer 15 and the silicon substrate 1 are set to 0 V. In a case of an erase cell (for example, a memory cell in which electrical charges are not injected into the floating gate 3), the threshold voltage is relatively low and thus a read current (memory cell current) flows. On the other hand, in a case of a program cell (for example, a memory cell in which electrical charges are injected into the floating gate 3), the threshold voltage is relatively high and thus a read current (memory cell current) scarcely flows. It is possible by detecting the read current (memory cell current) to sense whether the memory cell is a program cell or an erase cell, namely, whether data 0 is stored or data 1 is stored.

(Data Erasing)

Figure 10A:
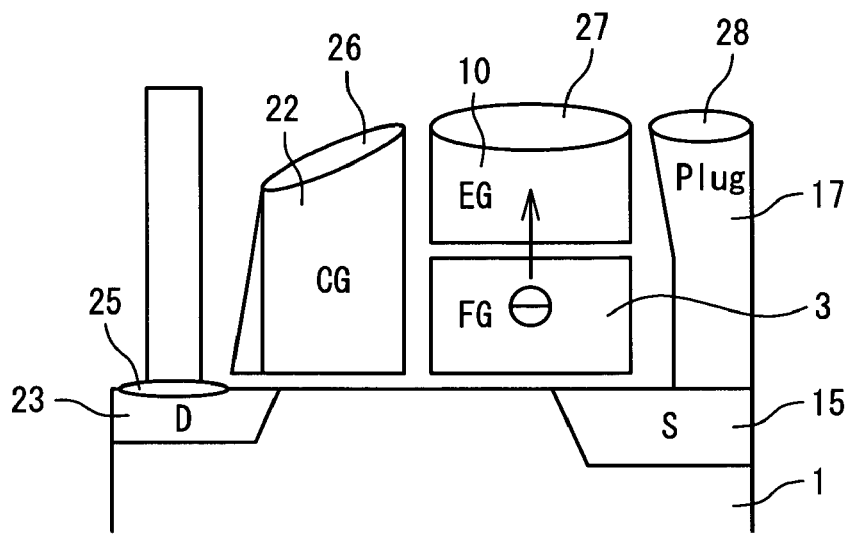
FIG. 10A is a conceptual view showing data erasing in the present embodiment.
Figure 10B:
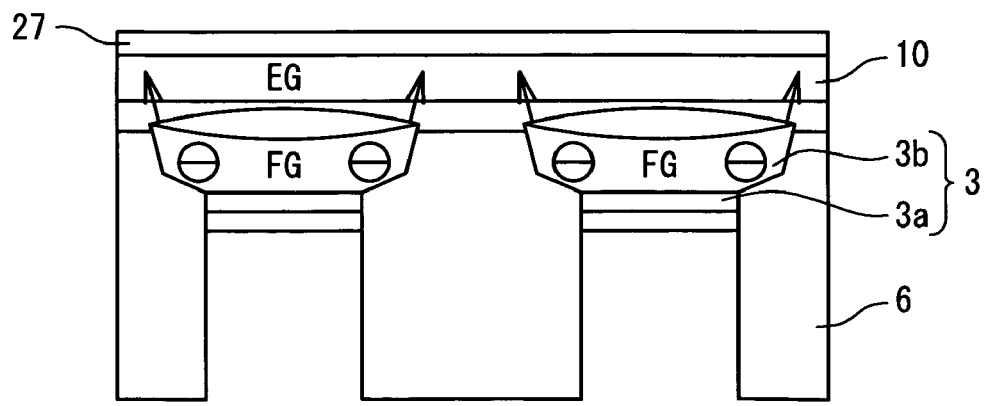
FIG. 10B is a conceptual view showing data erasing in the present embodiment.

Referring to FIGS. 10A and 10B, data erasing will be described. FIG. 10A shows a structure along the line A-A', and FIG. 10B shows a structure along the line B-B'. The data erasing is performed by the FN tunneling method. For example, a voltage of 10 V is applied to the erase gate 10, and voltages of the control gate 22, the first source/drain diffusion layer 15, the second source/drain diffusion layer 23 and the silicon substrate 1 are set to 0V. As a result, an intense electrical field is applied to the tunnel insulating film 9 between the erase gate 10 and the floating gate 3, and thereby an FN tunnel current flows. Consequently, electrons in the floating gate 3 are extracted to the erase gate 10 through the tunnel insulating film 9.

In particular, an intense electric field concentration occurs in the vicinity of the acute-angled portions 3c (the first side FE1 and second side FE2) of the floating gate 3 closer to the erase gate 10, due to the sharp shape of the acute-angled portions 3c. Therefore, as shown in FIG. 10B, electrons in the floating gate 3 are extracted mainly from the acute-angled portions 3c to the erase gate 10. It can be said that the acute-angled portions 3c of the floating gate 3 improve an electron extraction efficiency. According to the present embodiment, as described above, the acute-angled portion 3c of the floating gate 3 facing the erase gate 10 enables improvement in the erase efficiency and the erase speed.

Since electrons are extracted from the floating gate 3, the threshold voltage of the memory cell transistor is decreased. Note that, if a threshold voltage related to the floating gate 3 becomes negative due to over-erase, a channel can always occur in the silicon substrate 1 (P-well 7) below the floating gate 3. However, the control gate 22 is also provided on the channel region, which can prevent the memory cell from being always in the ON-state. In this manner, the split gate-type shows an advantage of preventing the over-erase error.

Moreover, in the erasing operation as described above, a high voltage is applied to the erase gate 10 provided separately from the control gate 22, and the FN tunneling occurs between the erase gate 10 and the floating gate 3. Since there is no need to apply a high voltage to the control gate 22, no deterioration of the second gate oxide film 20 immediately under the control gate 22 occurs. Accordingly, the second gate oxide film 20 can be made thin. As a result, it is possible to increase the memory cell current at the time of data reading even with a low voltage, which improves the read speed.

4. Example of Manufacturing Method

An example of a method of manufacturing the nonvolatile semiconductor memory device according to the present embodiment will be described below with reference to FIGS. 11 to 49. FIGS. 11 to 49 each shows an A-A' cross-sectional structure and a B-B' cross-sectional structure at each manufacturing process.

Figure 11:
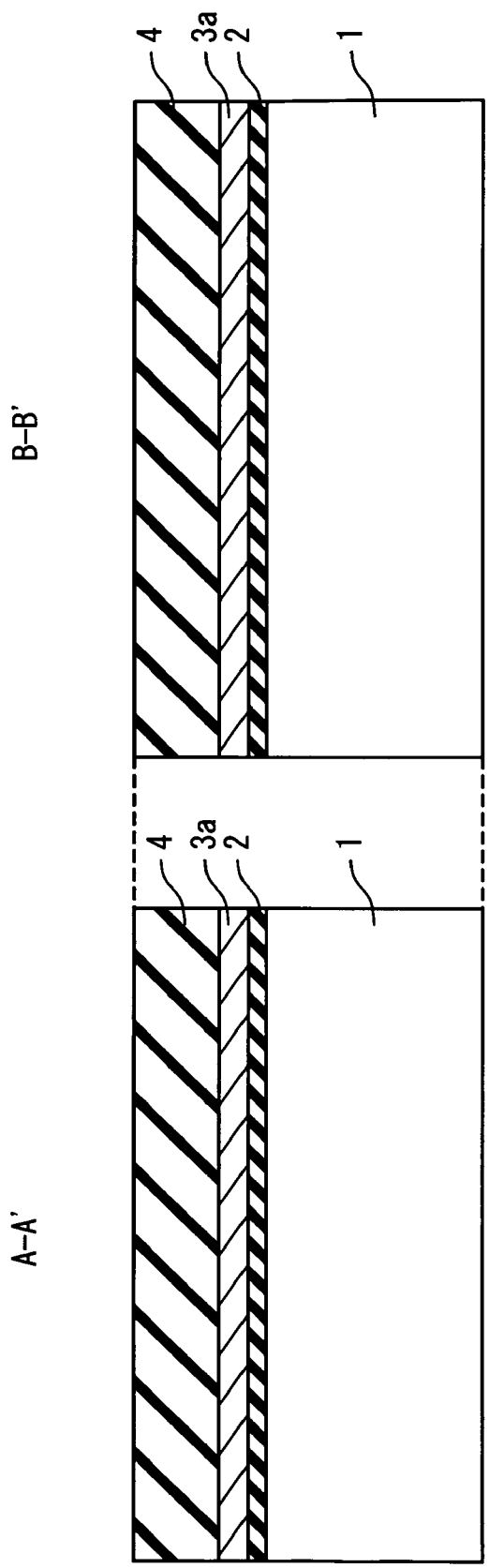

First, as shown in FIG. 11, by a thermal oxidation method, a first gate oxide film 2 having a thickness of about 8 to 10 nm is formed on the silicon substrate 1. Subsequently, by a CVD method, a first polysilicon film 3a having a thickness of about 80 to 100 nm is formed on the first gate oxide film 2. The first polysilicon film 3a is a material film (first gate material film) which becomes a part of the floating gate 3. Furthermore, by the CVD method, a field nitride film 4 having a thickness of about 100 nm to 150 nm is formed on the first polysilicon film 3a.

Figure 12:
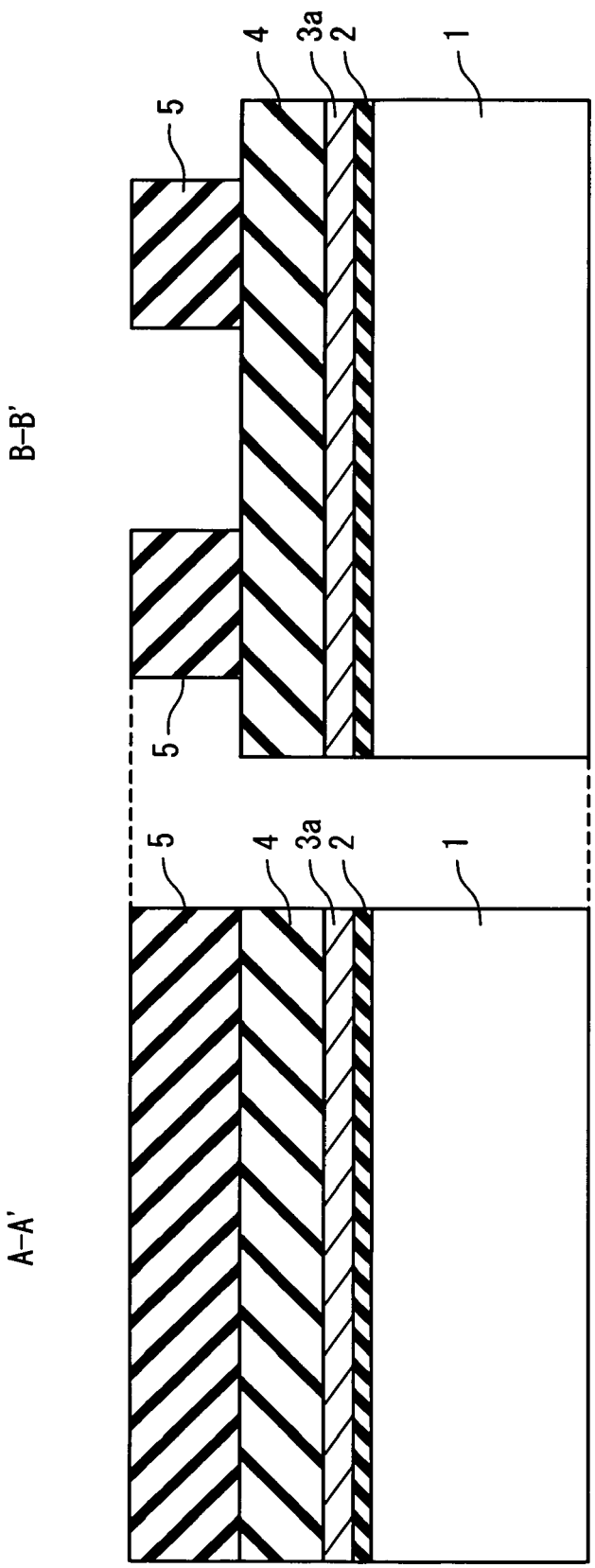

Next, as shown in FIG. 12, a first resist mask 5 for forming a device isolation structure is formed on the field nitride film 4. The first resist mask 5 has an opening pattern in a direction parallel to the line A-A'.

Figure 13:
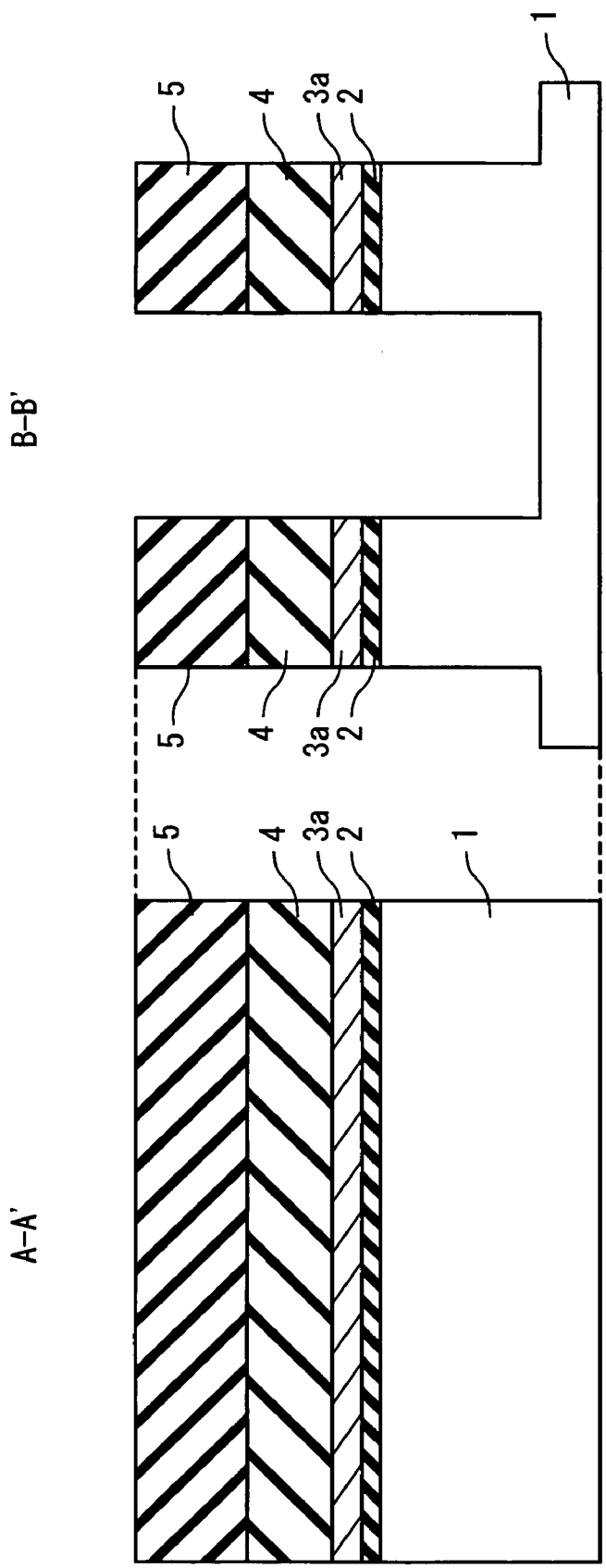

Next, as shown in FIG. 13, an anisotropic dry etching is performed by using the first resist mask 5 as a mask. As a result, the field nitride film 4, the first polysilicon film 3a and the first gate oxide film 2 are selectively removed in order. Furthermore, the silicon substrate 1 is etched up to a depth of about 300 nm to form trenches. Each trench is along the direction parallel to the line A-A'. After that, the first resist mask 5 is removed.

Figure 14:
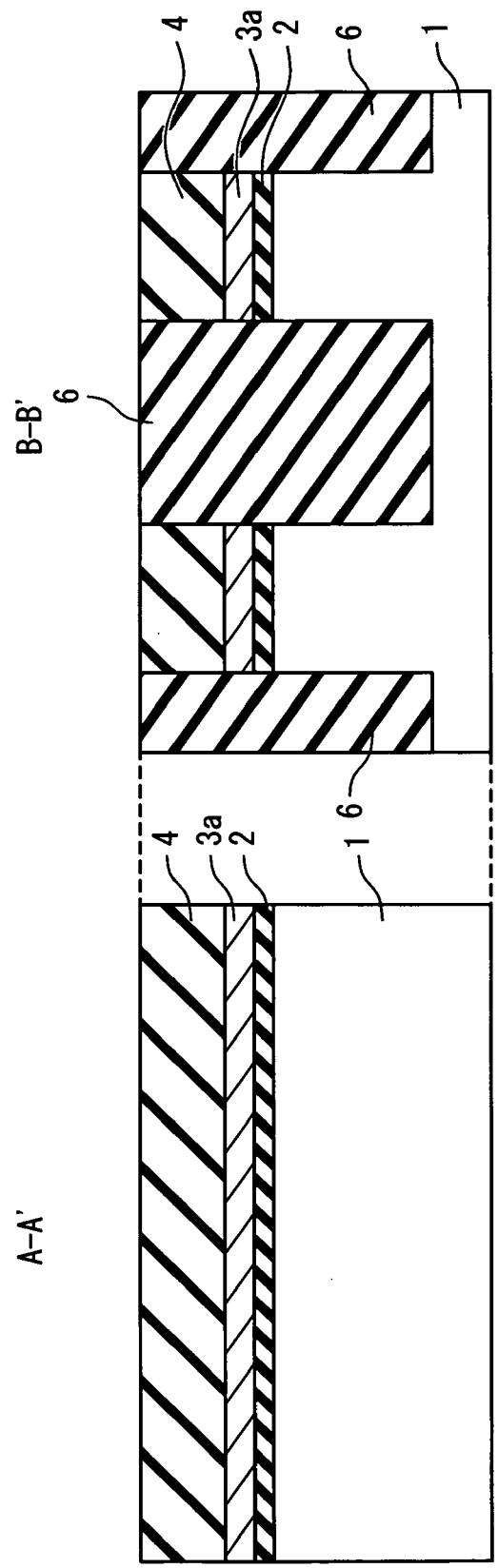

Next, by a plasma CVD method, an oxide film having a thickness of about 600 to 700 nm is blanket deposited. After that, by a CMP (Chemical Mechanical Polishing), a surface of the oxide film is planarized so as to have the same height as an upper surface of the field nitride film 4. As a result, as shown in FIG. 14, STIs 6 as the device isolation structures are so formed as to fill the trenches formed in the foregoing process. That is, each STI 6 is so formed as to penetrate through the field nitride film 4, the first polysilicon film 3a and the first gate oxide film 2 to protrude into the silicon substrate 1. As shown in FIG. 14, each STI 6 is so formed as to project from the silicon substrate 1 and has the projecting portions (PR1, PR2; see also FIG. 7). Each STI 6 is along the direction parallel to the line A-A'.

Figure 15:
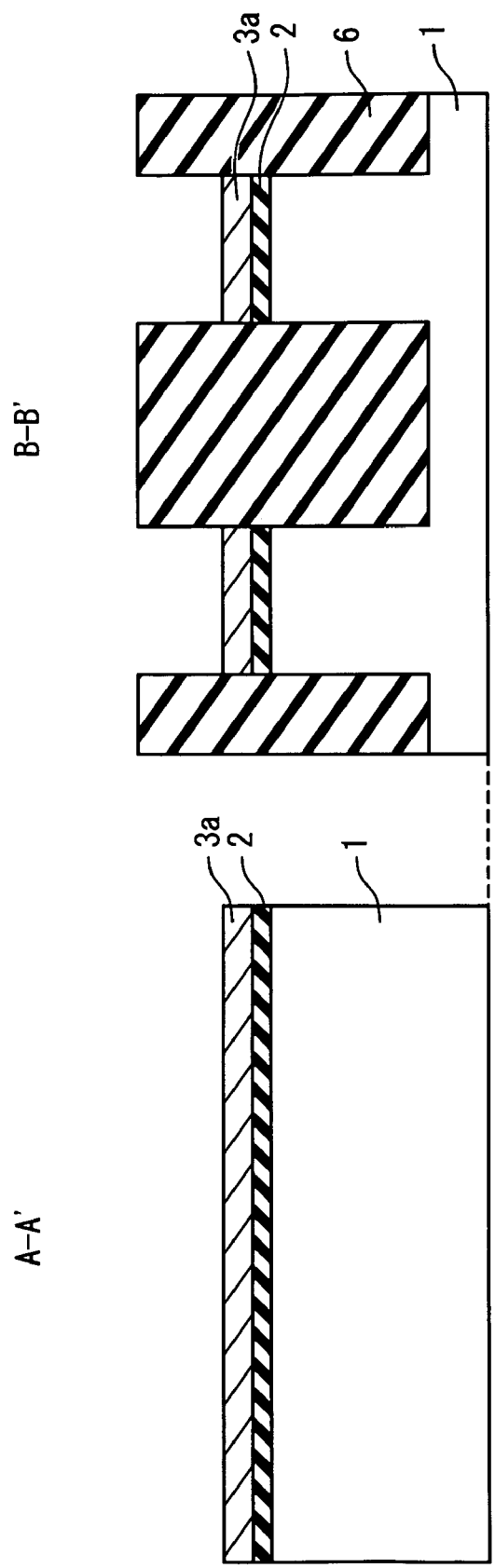

Next, as shown in FIG. 15, the field nitride film 4 is removed by immersing in a phosphoric acid solution of 140 to 160° C. for about 30 to 40 minutes.

Figure 16:
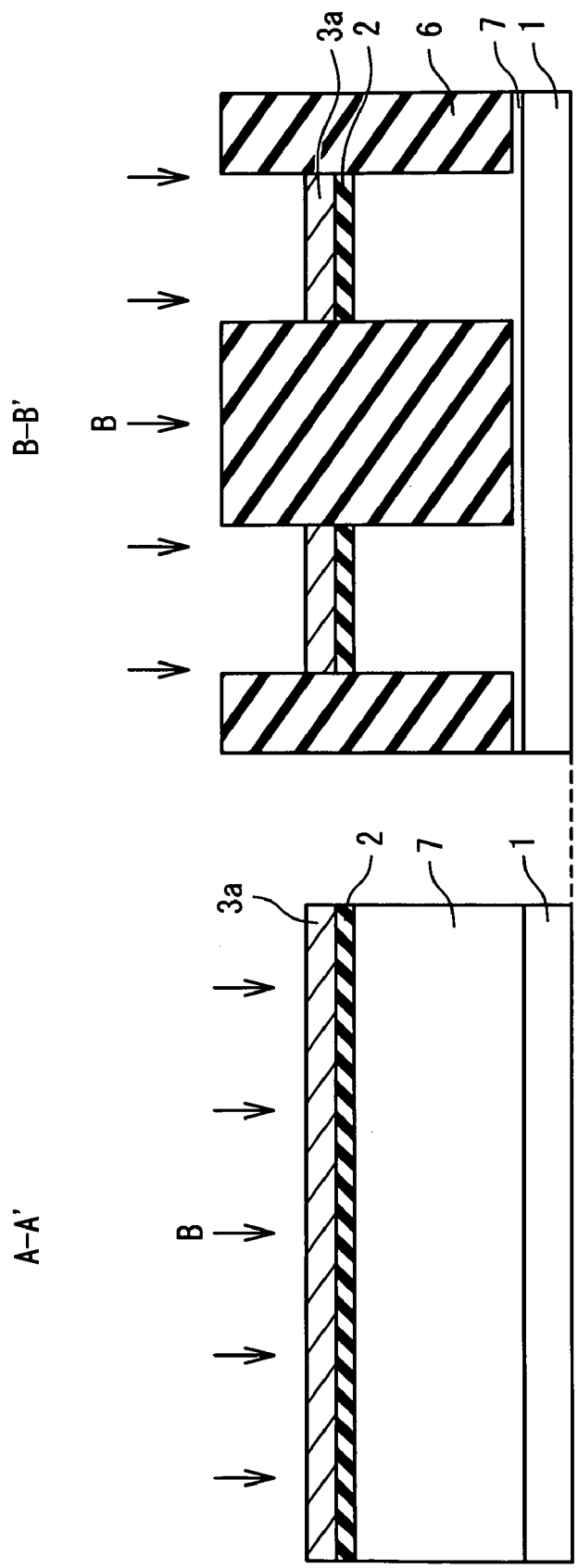

Next, as shown in FIG. 16, boron (B) ions are injected at injection energy of 130 to 150 keV and dose amount of $4.0 \times 10^{12}$ to $6.0 \times 10^{12}$ cm$^{-2}$, for example. The boron ions pass through the first polysilicon film 3a and the first gate oxide film 2 and are injected into the silicon substrate 1. After that, for activation, a heat treatment is performed in nitrogen atmosphere at about 900 to 1000° C. As a result, the P-well 7 is formed in the silicon substrate 1.

Figure 17:
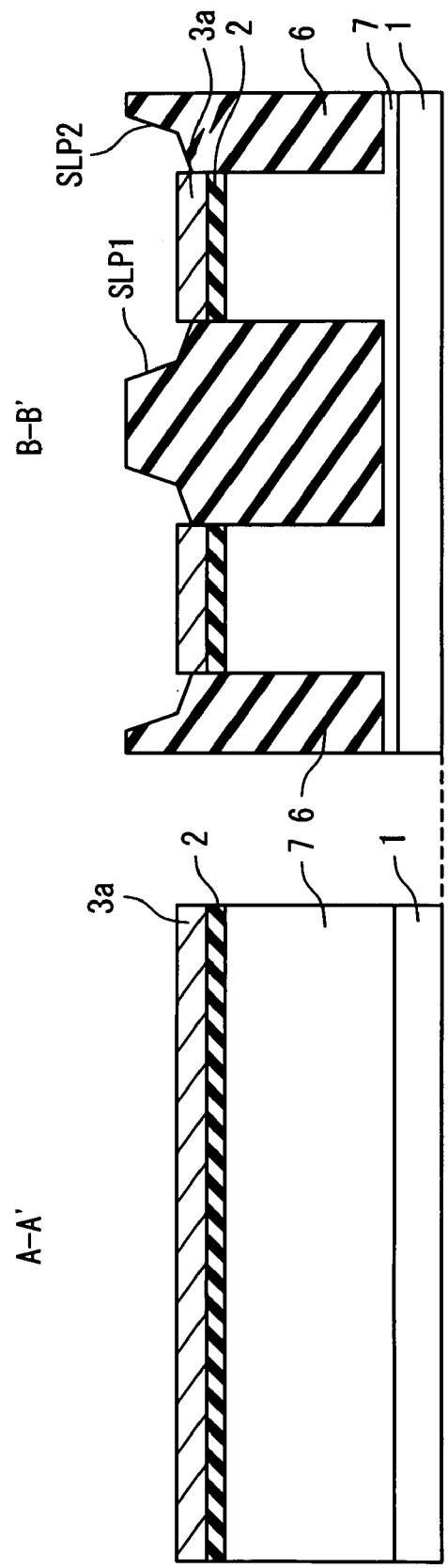

Next, an oxide film wet etching is performed for 3 to 4 minutes by using fluorinated acid. Consequently, as shown in FIG. 17, upper corner portions of each STI 6 (projecting portions PR1, PR2) are etched to form curved sloping surfaces (SLP1, SLP2; see also FIG. 7) on each STI 6. As shown in FIG. 17, the respective sloping surfaces SLP1 and SLP2 of adjacent STIs 6 face each other, and an interval between the sloping surfaces SLP1 and SLP2 becomes larger away from the silicon substrate 1. It should be noted here that the first polysilicon film 3a has been already formed prior to the present etching process. The first polysilicon film 3a has at least a portion located on the silicon substrate side of the sloping surfaces (SLP1, SLP2). Conversely speaking, the present etching is performed such that the sloping surfaces (SLP1, SLP2) are located above a bottom surface of the first polysilicon film 3a (an upper surface of the first gate oxide film 2). Therefore, it can be prevented that a part of the semiconductor substrate 1 is removed due to an over-etching and a so-called "divot" occurs. In this etching process, the first polysilicon film 3a plays a role of protecting the semiconductor substrate 1 and prevents the occurrence of the divot. According to the present embodiment, the sloping surfaces (SLP1, SLP2) of the STI 6 can be suitably formed without generating divot.

Figure 18:
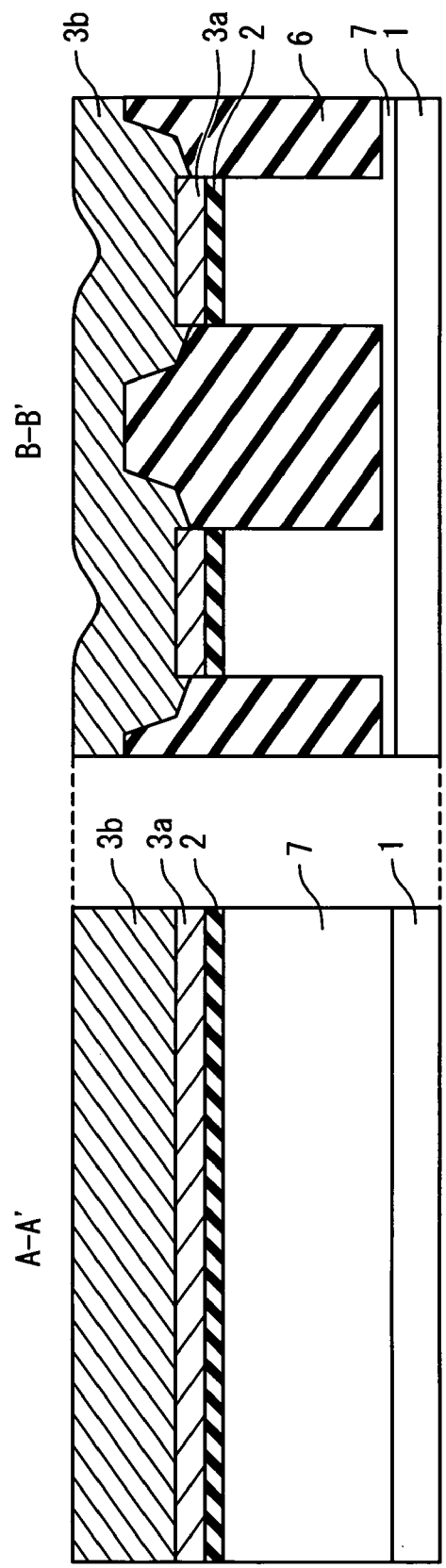

Next, as shown in FIG. 18, by the CVD method, a second polysilicon film 3b having a thickness of about 300 to 400 nm is blanket deposited. As in the case of the first polysilicon film 3a, the second polysilicon film 3b is a material film (second gate material film) which forms a portion of the floating gate 3.

Figure 19:
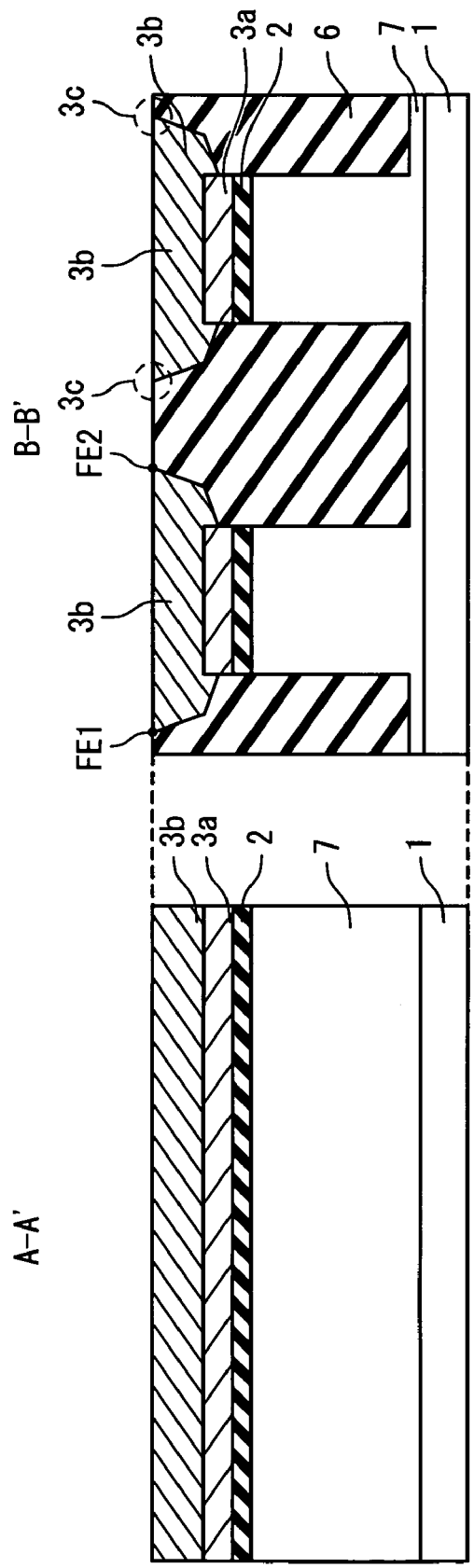

Next, as shown in FIG. 19, by the CMP, a surface of the second polysilicon film 3b is planarized so as to have the same height as an upper surface of the STI 6. As a result, the second polysilicon film 3b is so formed on the first polysilicon film 3a as to be sandwiched between the sloping surfaces (SLP1, SLP2) of the STI 6. Both side surfaces of the second polysilicon film 3b overlap the STI 6 and are in contact with the sloping surfaces (SLP1, SLP2) of the STI 6. In this manner, a structure extending in the A-A' direction is formed of the first polysilicon film 3a and the second polysilicon film 3b which are material of the floating gate 3, wherein the structure is hereinafter referred to as a "gate structure". The gate structure is formed on the first gate oxide film 2 and is sandwiched between adjacent STIs 6 (namely, between projecting portions PR1 and PR2; see also FIG. 7). As described later, the floating gate 3 is formed by patterning the gate structure. As shown in FIG. 19, an upper surface of the gate structure includes a first side FE1 and a second side FE2 that are along the line A-A'. The first side FE1 and the second side FE2 become the acute-angled portions 3c of the upper surface of the floating gate 3.

Figure 20:
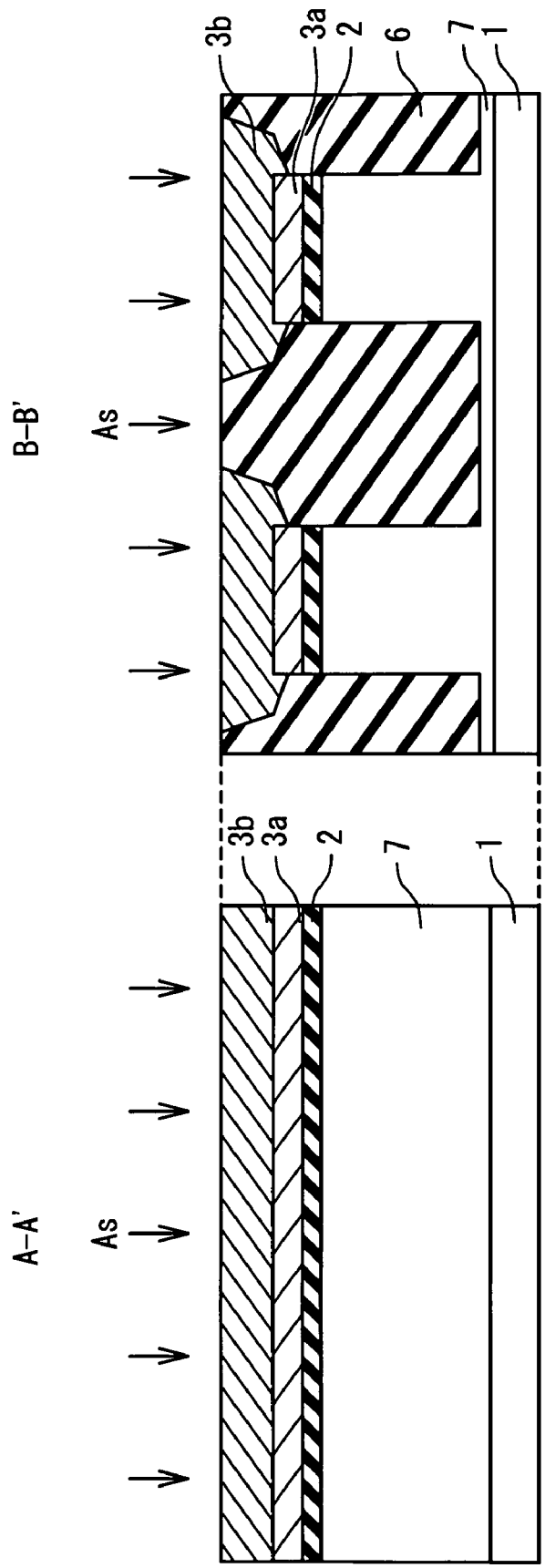

Next, as shown in FIG. 20, N-type impurities (e.g. arsenic (As), injection energy: 5 keV, dose amount: $1.0 \times 10^{15}$ cm$^{-2}$) are injected in order to make the first polysilicon film 3a and the second polysilicon film 3b conductive. Alternatively, the first polysilicon film 3a and the second polysilicon film 3b may be doped with phosphorus by using trichloride phosphate (POCL$_3$) as a thermal diffusion source. After that, for activation, a heat treatment is performed in nitrogen atmosphere of about 800° C.

Figure 21:
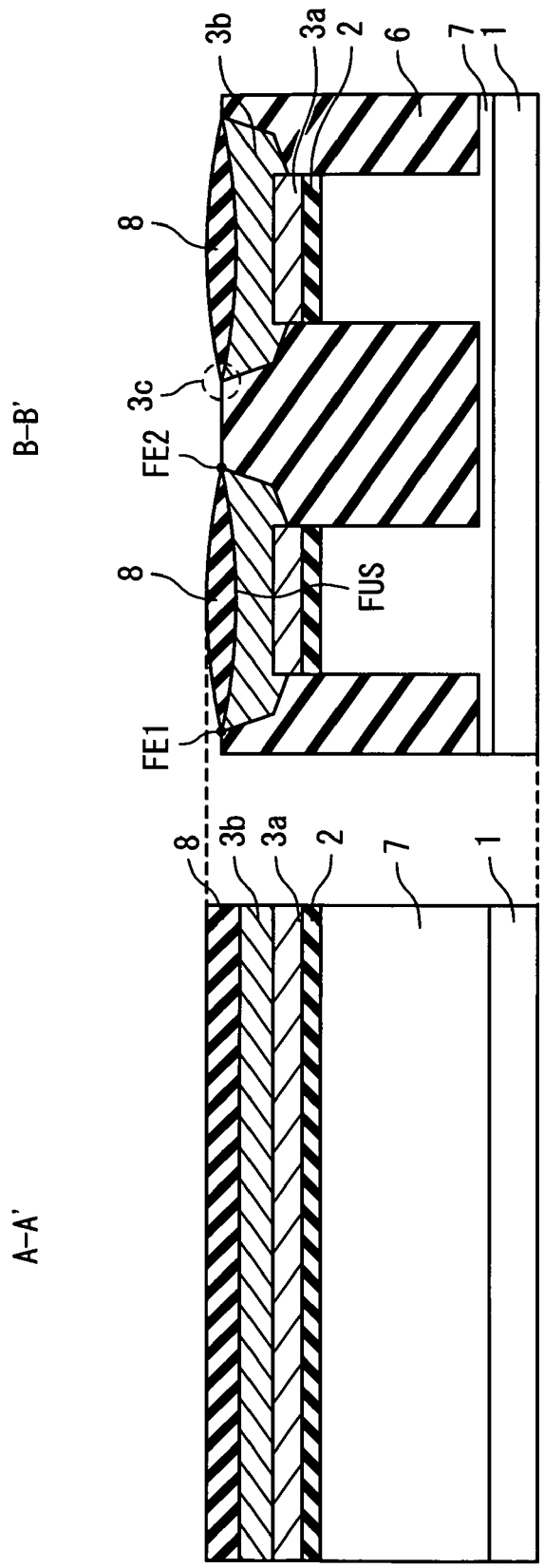

Next, as shown in FIG. 21, an insulating film is formed on the upper surface of the second polysilicon film 3b. Here, the thermal oxidation method is employed, and an oxide film 8 is formed on the surface of the second polysilicon film 3b. At this time, the oxide film 8 is formed to be thickest at the center portion and become thinner towards its edge portions. Consequently, the upper surface FUS of the second polysilicon film 3b has a dent shape (curved shape). As a result, each of the acute-angled portions 3c at the first side FE1 and the second side FE2 of the upper surface FUS becomes sharper to have a sharp angle of about 30 to 40 degrees.

Figure 22:
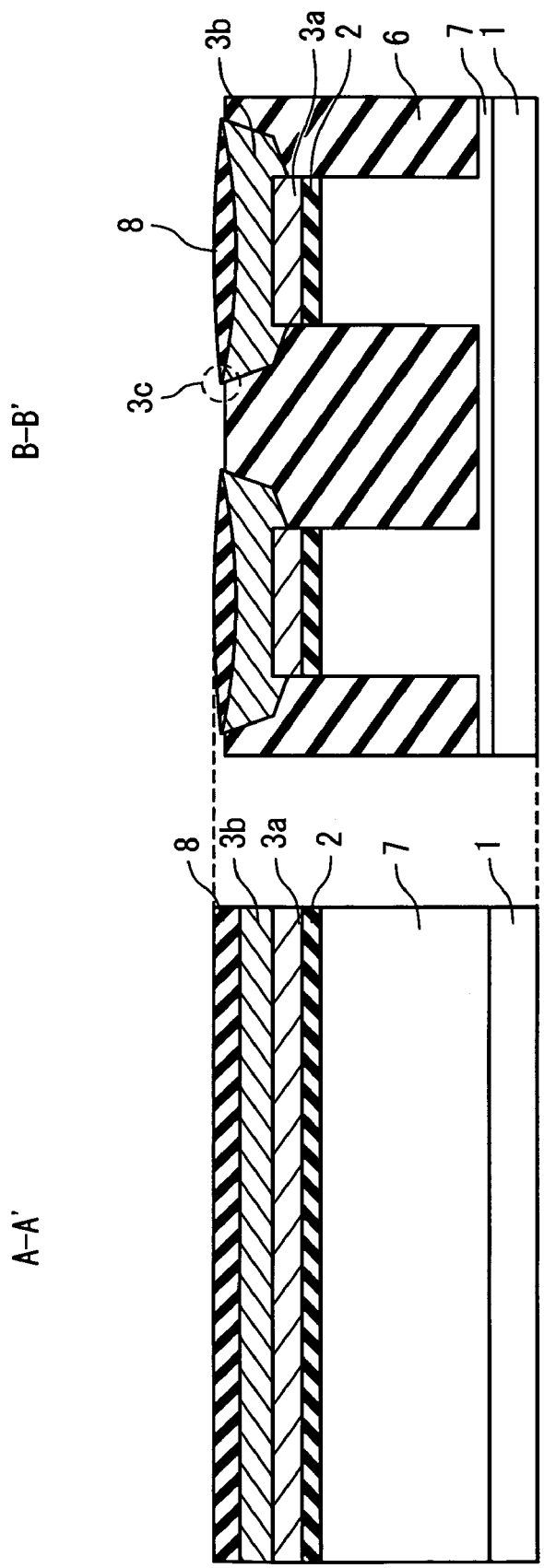

Next, as shown in FIG. 22, the surfaces of the oxide film 8 and the STIs 6 are removed by about 10 nm by an etching using fluorinated acid. As a result, the acute-angled portions 3c of the second polysilicon film 3b are exposed.

Figure 23:
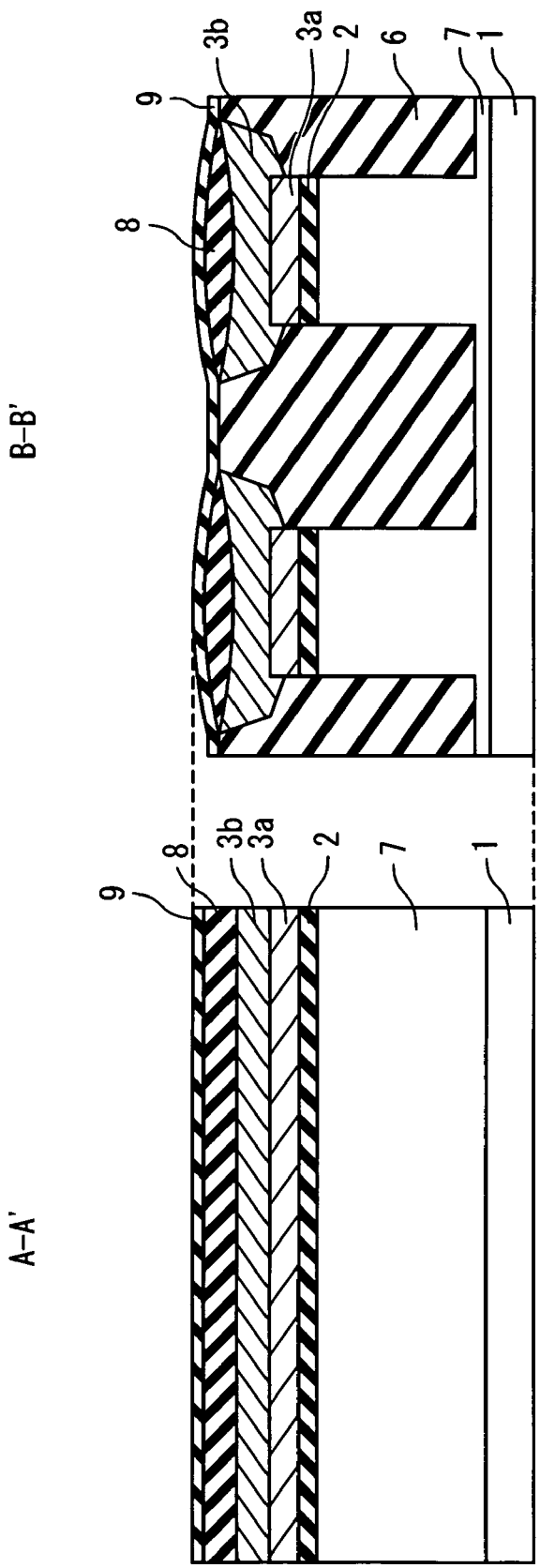

Next, as shown in FIG. 23, a tunnel oxide film 9 having a thickness of about 14 to 16 nm is blanket deposited by the CVD method. The tunnel oxide film 9 is so formed as to cover the oxide film 8, the acute-angled portions 3c of the second polysilicon film 3b and the STIs 6. That is to say, the acute-angled portions 3c of the second polysilicon film 3b are in contact with the tunnel oxide film 9. In this manner, an insulating film including the oxide film 8 and the tunnel oxide film 9 is formed on the above-mentioned gate structure. A thickness of the insulating film on the gate structure is smaller on the first side FE1 and the second side FE2 than between the first side FE1 and the second side FE2. In other words, the insulating film on the gate structure is thickest at the center portion and becomes thinner towards its edge portions. After the formation of the tunnel oxide film 9, a thermal oxide film may be further formed by a thermal oxidation.

Figure 24:
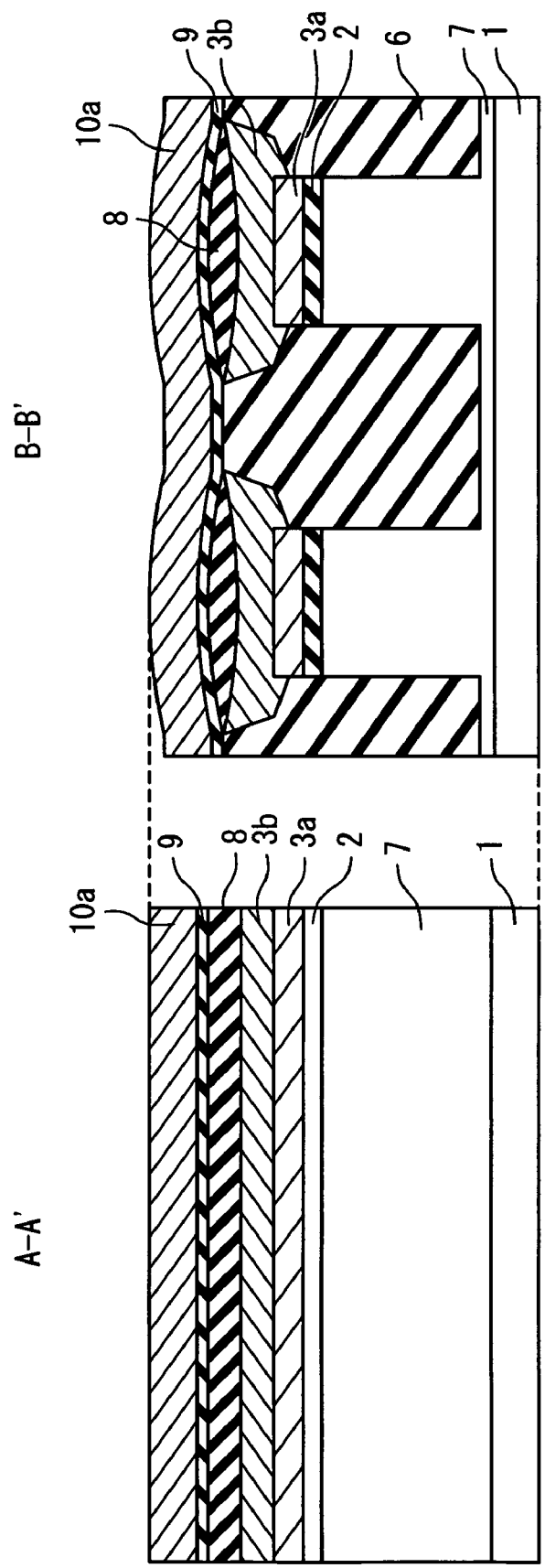

Next, as shown in FIG. 24, by the CVD method, a third polysilicon film 10a is formed on the tunnel oxide film 9. The third polysilicon film 10a is a material film (third gate material film) which becomes the erase gate 10. The third polysilicon film 10a faces the upper surface of the gate structure which becomes the floating gate 3. In particular, the third polysilicon film 10a faces the acute-angled portions 3c (the first side FET and second side FE2) of the second polysilicon film 3b across the tunnel oxide film 9. Since the gate structure is embedded in a region between the projecting portions of the STIs 6 and the tunnel oxide film 9 is so formed as to cover the STI 6, the third polysilicon film 10a formed on the tunnel oxide film 9 is consequently located above the upper surface of the gate structure. That is, the third polysilicon film 10a does not face side surfaces of the gate structure.

Figure 25:
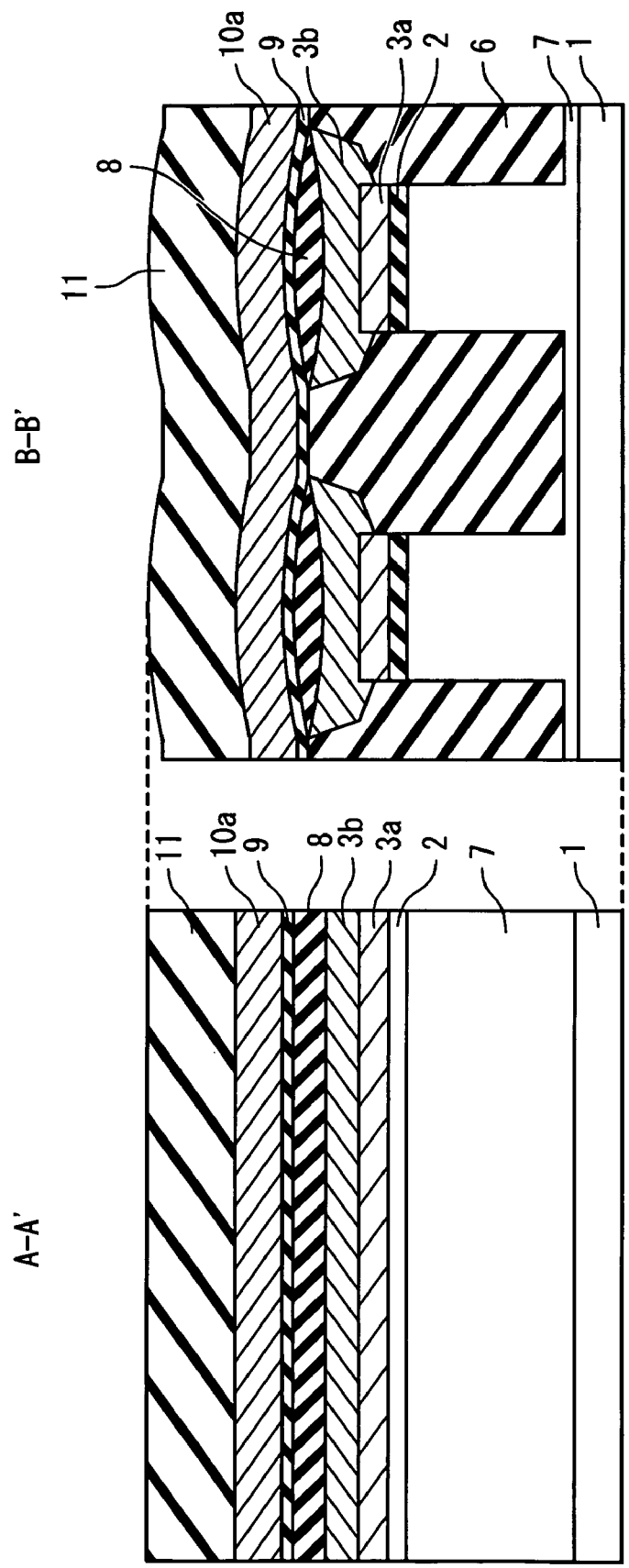

Next, as shown in FIG. 25, a nitride film 11 having a thickness of about 200 to 300 nm is blanket deposited by the CVD method.

Figure 26:
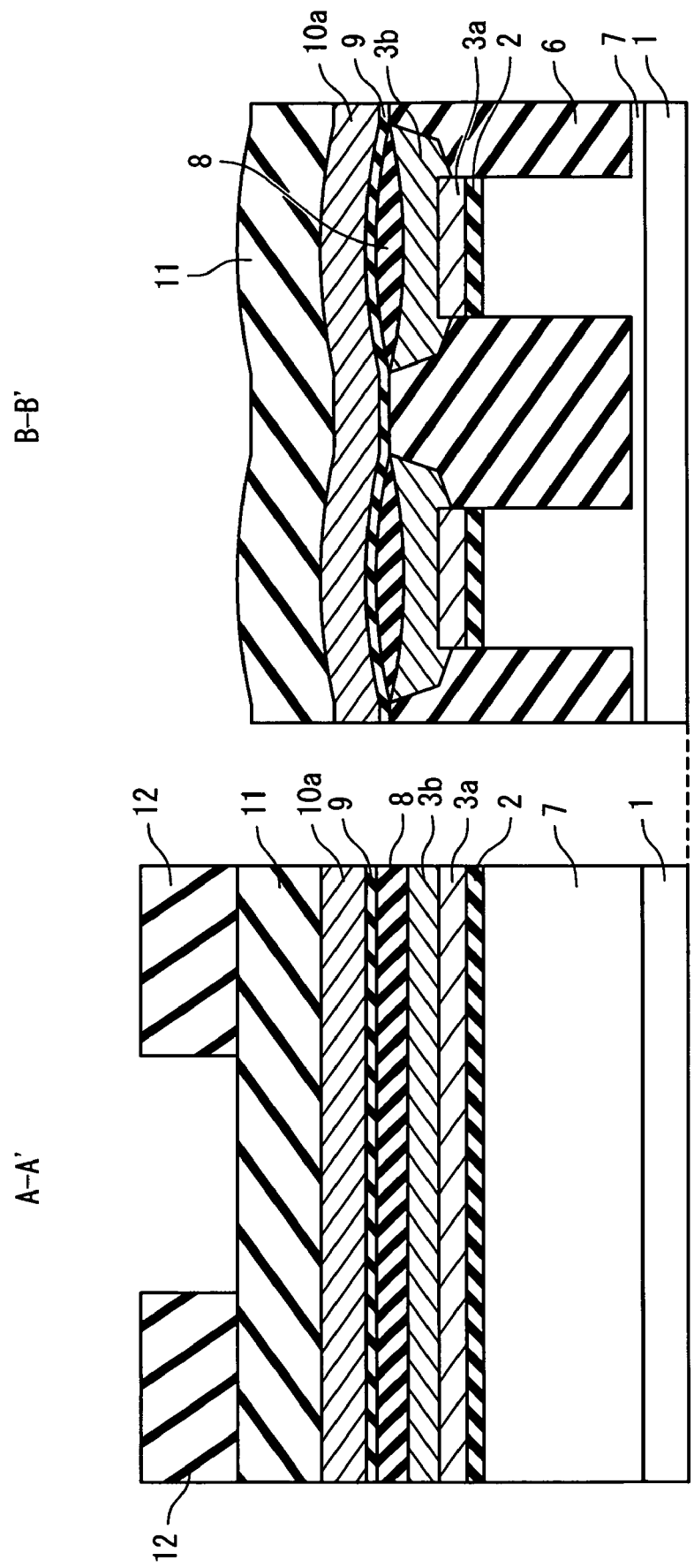

Next, as shown in FIG. 26, a second resist mask 12 is formed on the nitride film 11. The second resist mask 12 has an opening pattern in the direction parallel to the line B-B'.

Next, as shown in FIG. 27, the nitride film 11 is selectively removed by an anisotropic dry etching. As a result, the nitride film 11 has an opening pattern in the direction parallel to the line B-B'. After that, the second resist mask 12 is removed.

Next, an oxide film having a thickness of about 150 to 200 nm is blanket deposited by the CVD method, and then an etch-back is performed. Consequently, as shown in FIG. 28, a first oxide film sidewall spacer 13 is formed on side surface of the opening of the nitride film 11. A width of the first oxide film sidewall spacer 13 determines a gate length of the floating gate 3.

Figure 29:
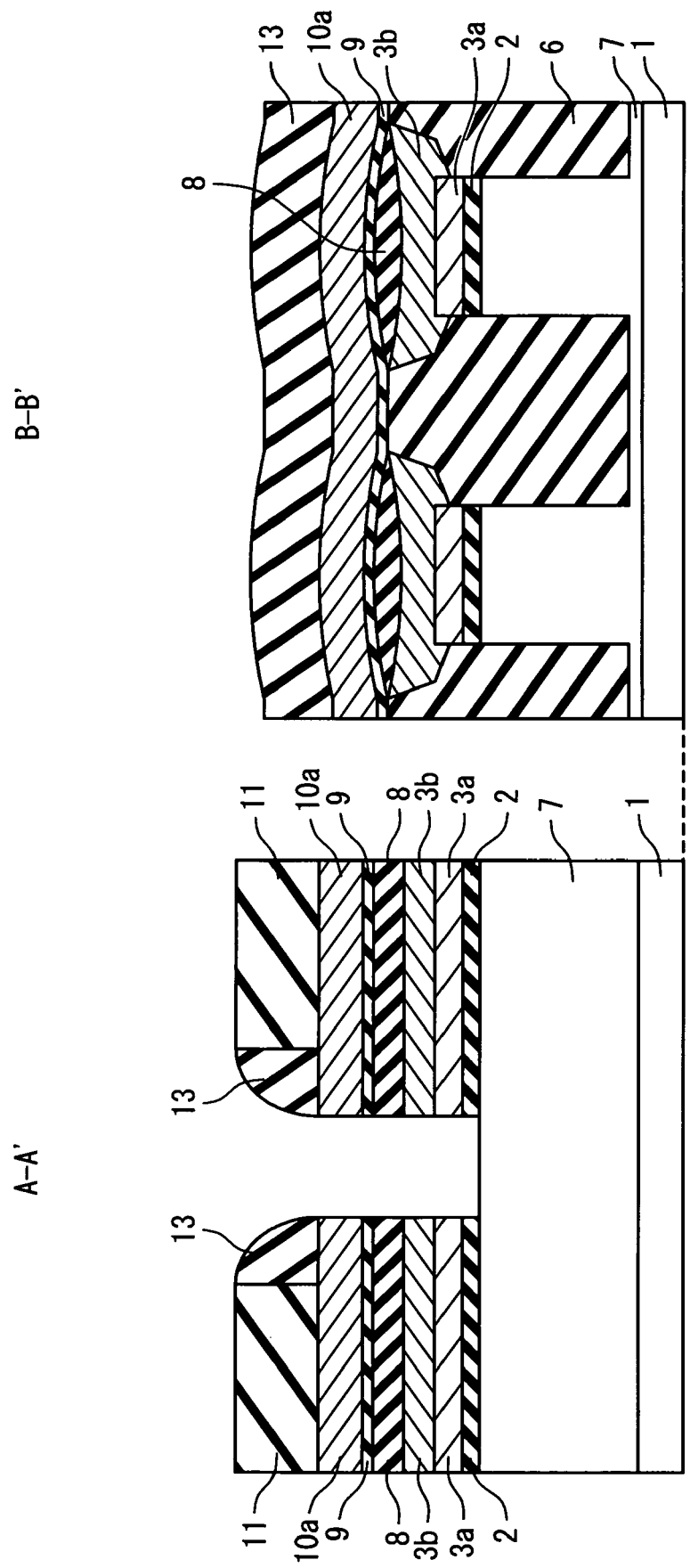

Next, as shown in FIG. 29, an anisotropic dry etching is performed by using the first oxide film sidewall spacer 13 as a mask. Thereby, the third polysilicon film 10a, the tunnel oxide film 9, the oxide film 8, the second polysilicon film 3b, the first polysilicon film 3a and the second gate oxide film 2 are selectively removed in order. As a result, an opening is formed on the silicon substrate 1 (P-well 7).

Figure 30:
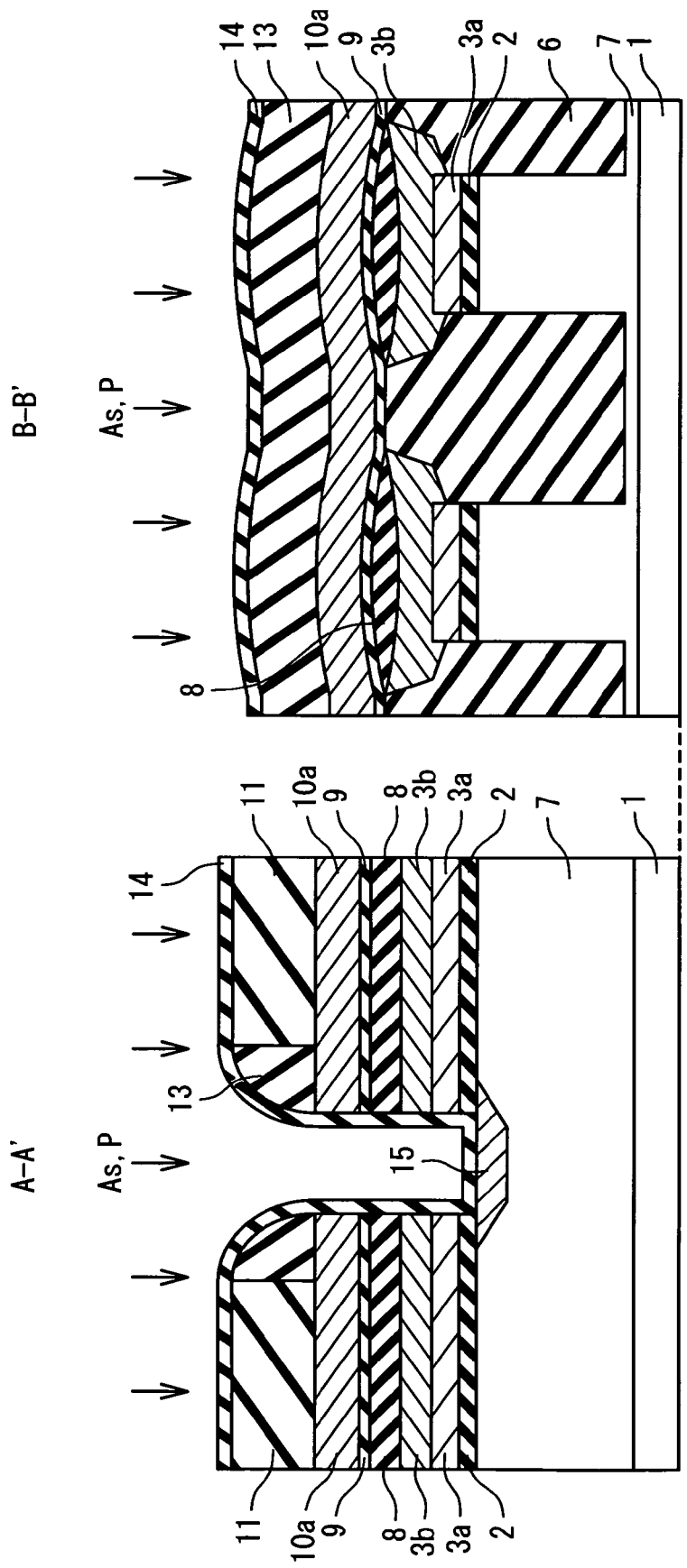

Next, as shown in FIG. 30, an oxide film 14 having a thickness of about 10 to 20 nm is blanket formed. Subsequently, an ion injection of N-type impurities is performed, and then, for activation, a heat treatment is performed in nitrogen atmosphere of about 1000° C. Consequently, the first source/drain diffusion layer 15 is formed in the silicon substrate 1 (P-well 7) under the above-mentioned opening. The ion injection is performed, for example, by injecting arsenic (As) at the injection energy of 40 keV and the dose amount of $1.0 \times 1.0^{14}$ cm$^{-2}$ and further injecting phosphorus (P) at the injection energy of 30 keV and the dose amount of $1.0 \times 10^{14}$ cm$^{-2}$. It should be note that a part of the first source/drain diffusion layer 15 is formed under the first gate oxide film 2. In other words, the first source/drain diffusion layer 15 is so formed as to partially overlap the first polysilicon film 3a and the second polysilicon film 3b.

Next, as shown in FIG. 31, the oxide film 14 is etched-back by an anisotropic dry etching. As a result, a second oxide film sidewall spacer 16 is formed to cover side walls of the opening on the first source/drain diffusion layer 15. The second oxide film sidewall spacer 16 covers side walls of the first oxide film sidewall spacer 13, the third polysilicon film 10a, the tunnel oxide film 9, the oxide film 8, the second polysilicon film 3b, the first polysilicon film 3a and the second gate oxide film 2.

Figure 32:
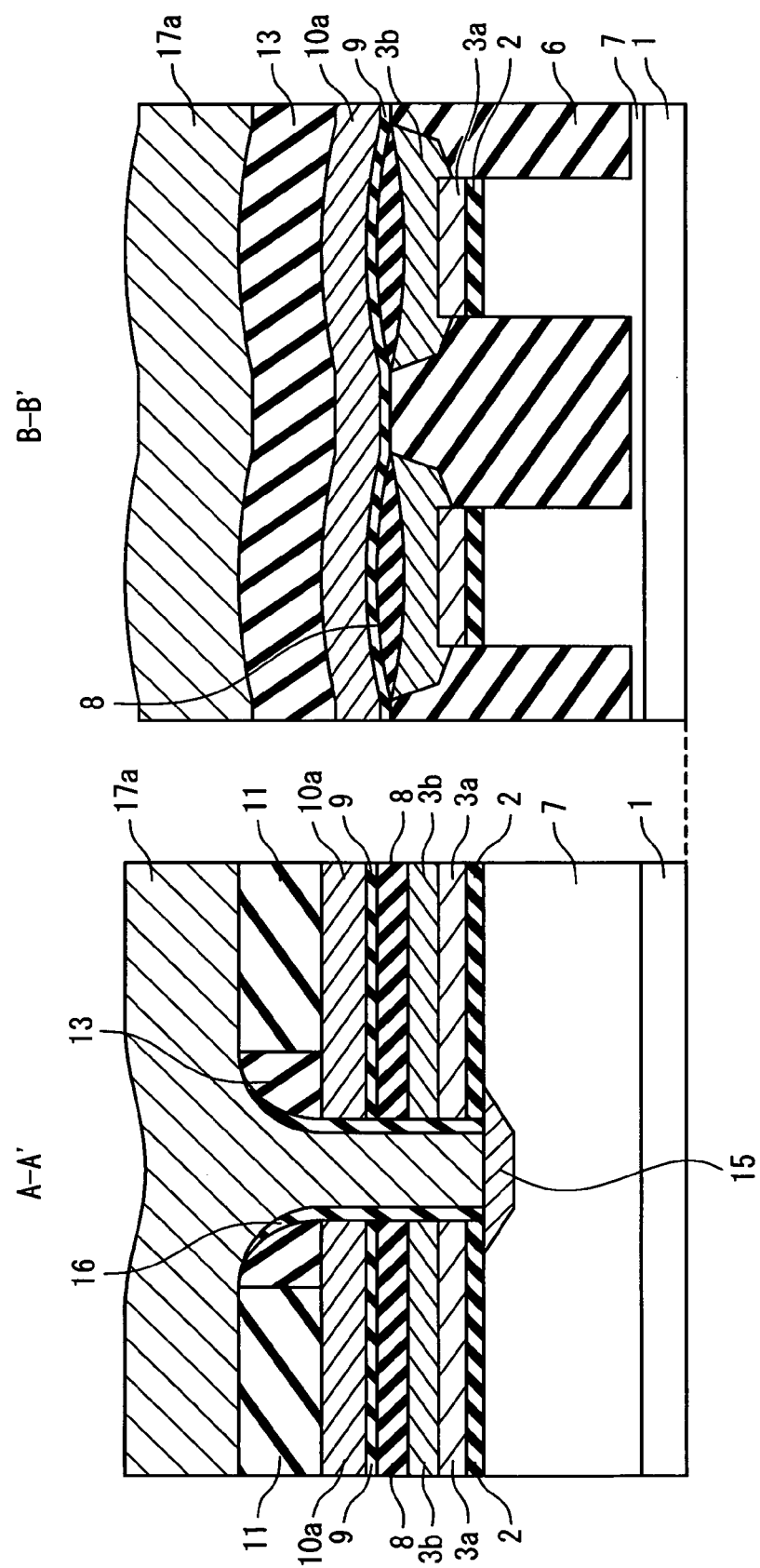

Next, as shown in FIG. 32, a fourth polysilicon film 17a having a thickness of about 500 to 600 nm is formed. The fourth polysilicon film 17a is a material film of the plug 17 connected to the first source/drain diffusion layer 15 and is embedded in the opening on the first source/drain diffusion layer 15. For example, the fourth polysilicon film 17a is doped with phosphorus of about $1.0 \times 10^{19}$ cm$^{-2}$ to $5.0 \times 10^{20}$ cm$^{-2}$.

Figure 33:
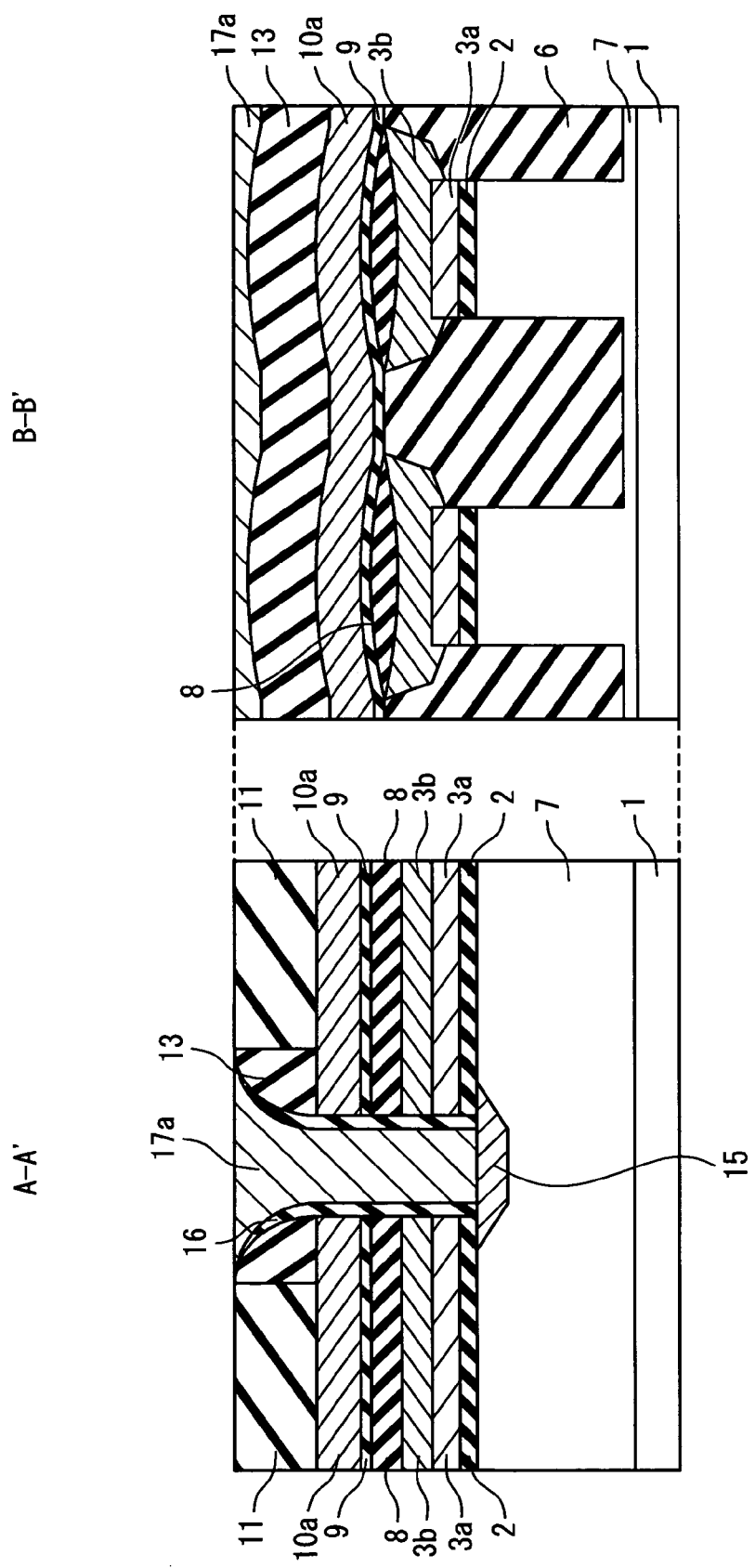

Next, as shown in FIG. 33, by the CMP, a surface of the fourth polysilicon film 17a is planarized until a surface of the nitride film 11 is exposed. That is, the surface of the fourth polysilicon film 17a is planarized so as to have the same height as the upper surface of the nitride film 11.

Figure 34:
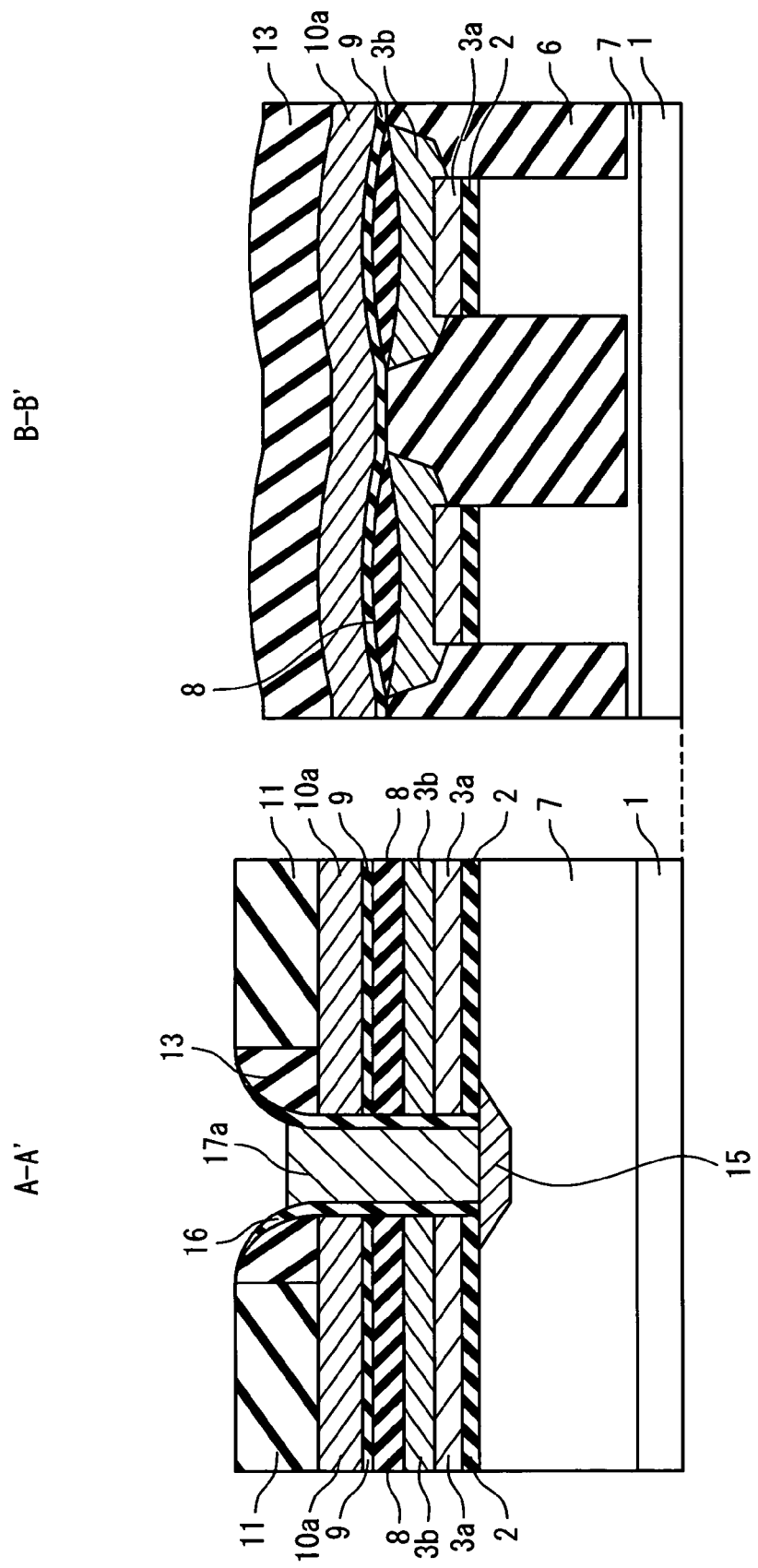

Next, as shown in FIG. 34, a part of the fourth polysilicon film 17a is etched so that a height of the fourth polysilicon film 17a is reduced. The etching is performed such that the upper surface of the fourth polysilicon film 17a is located above the upper surface of the third polysilicon film 10a by about 30 to 50 nm.

Figure 35:
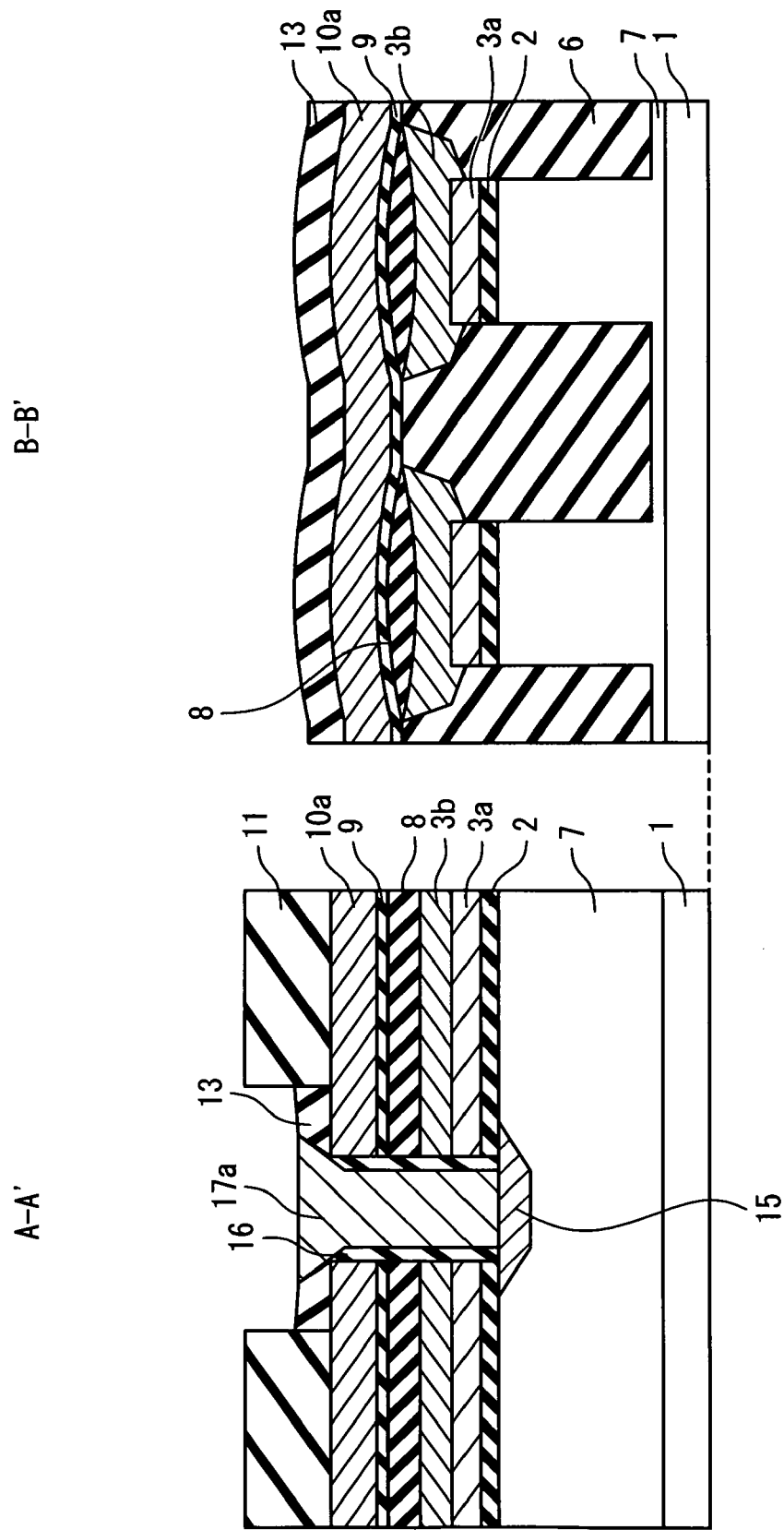

Next, as shown in FIG. 35, a part of the first oxide film sidewall spacer 13 is etched until an upper surface of the first oxide film sidewall spacer 13 has the same height as the upper surface of the fourth polysilicon film 17a.

Figure 36:
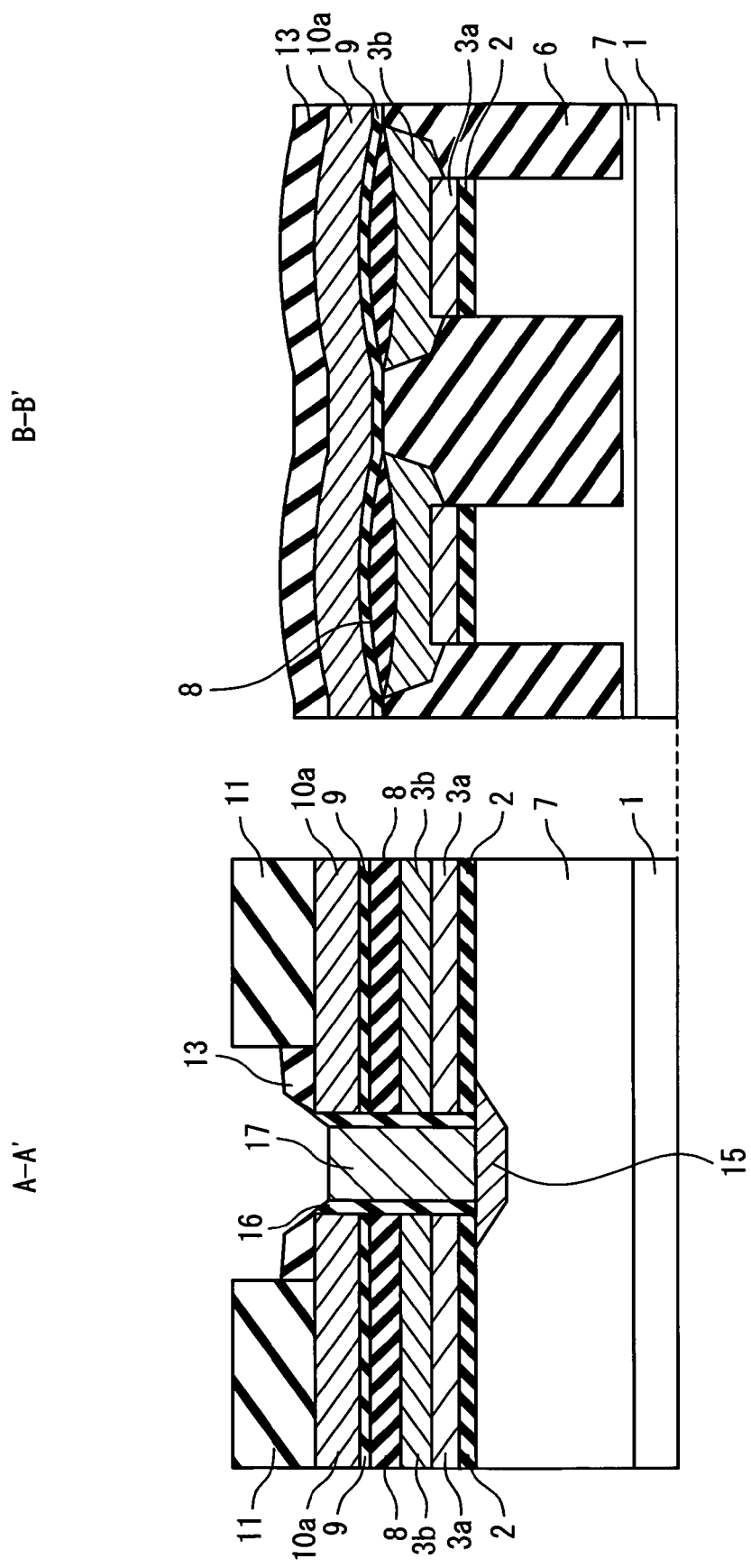

Next, as shown in FIG. 36, a part of the fourth polysilicon film 17a is etched such that the upper surface of the fourth polysilicon film 17a is located below the upper surface of the third polysilicon film 10a by about 30 to 50 nm. In this manner, the plug 17 connected to the first source/drain diffusion layer 15 is completed.

Figure 37:
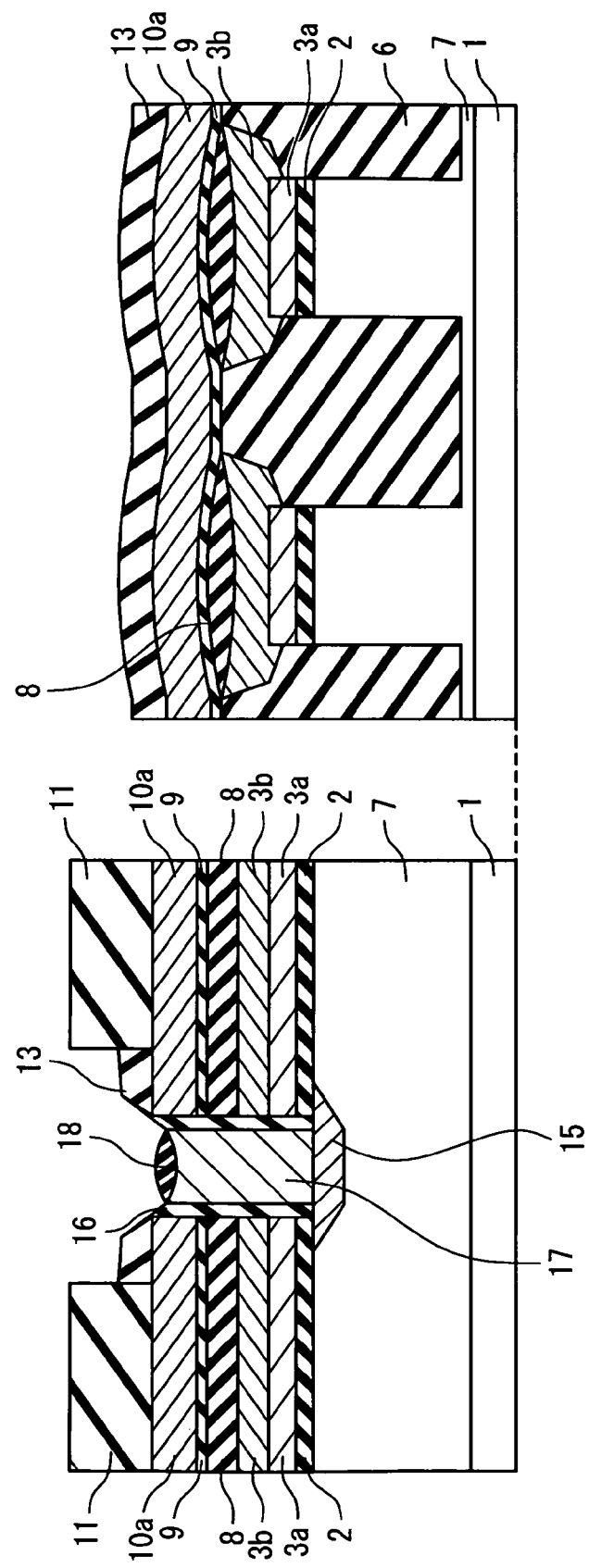

Next, as shown in FIG. 37, by performing a thermal oxidation at 800 to 900° C., a plug oxide film 18 having a thickness of about 20 to 50 nm is formed on an upper surface of the plug 17.

Figure 38:
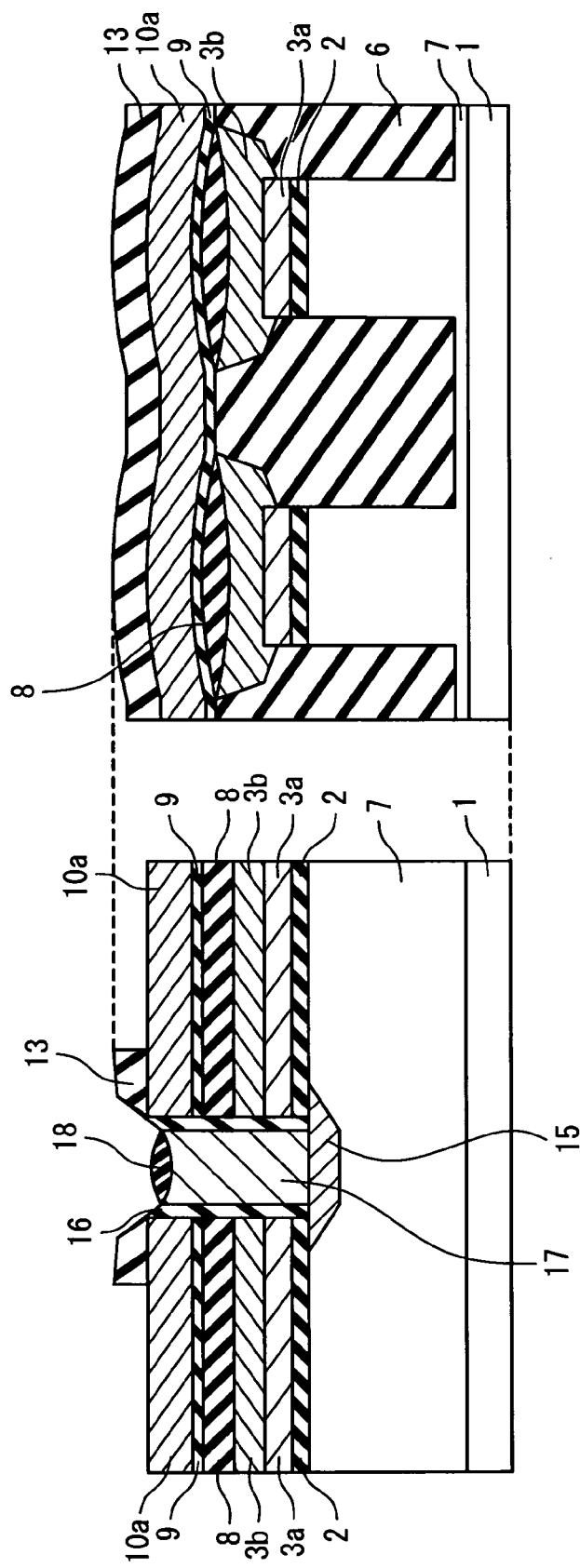

Next, as shown in FIG. 38, the nitride film 11 is removed by immersing in a phosphoric acid solution at about 140 to 160° C. for 60 to 100 minutes.

Figure 39:
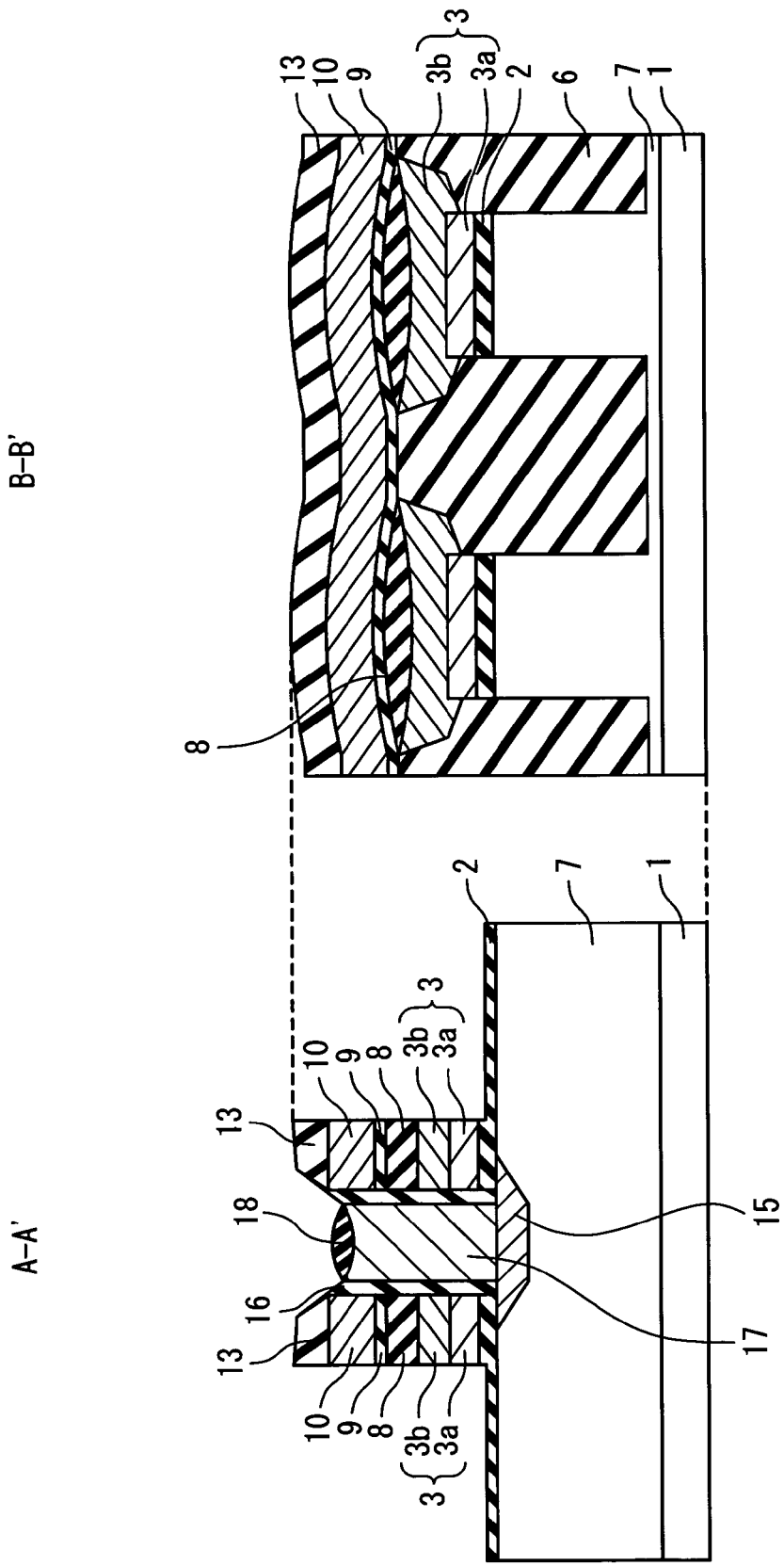

Next, as shown in FIG. 39, an anisotropic dry etching is performed by using the first oxide film sidewall spacer 13, the second oxide film sidewall spacer 16 and the plug oxide film 18 as a mask. Thereby, the third polysilicon film 10a, the tunnel oxide film 9, the oxide film 8, the second polysilicon film 3b and the first polysilicon film 3a are selectively removed in order. At this time, a thickness of an exposed portion of the first gate oxide film 2 is decreased to about 5 nm due to the dry etching. The present process corresponds to a patterning process for forming the erase gate 10 and the floating gate 3. That is to say, by patterning the third polysilicon film 10a and the gate structure (the first polysilicon film 3a and second polysilicon film 3b), the erase gate 10 is formed from the third polysilicon film 10a and the floating gate 3 is formed from the gate structure (3a, 3b). The erase gate 10 and the floating gate 3 thus formed have the features described referring to FIG. 7.

Figure 40:
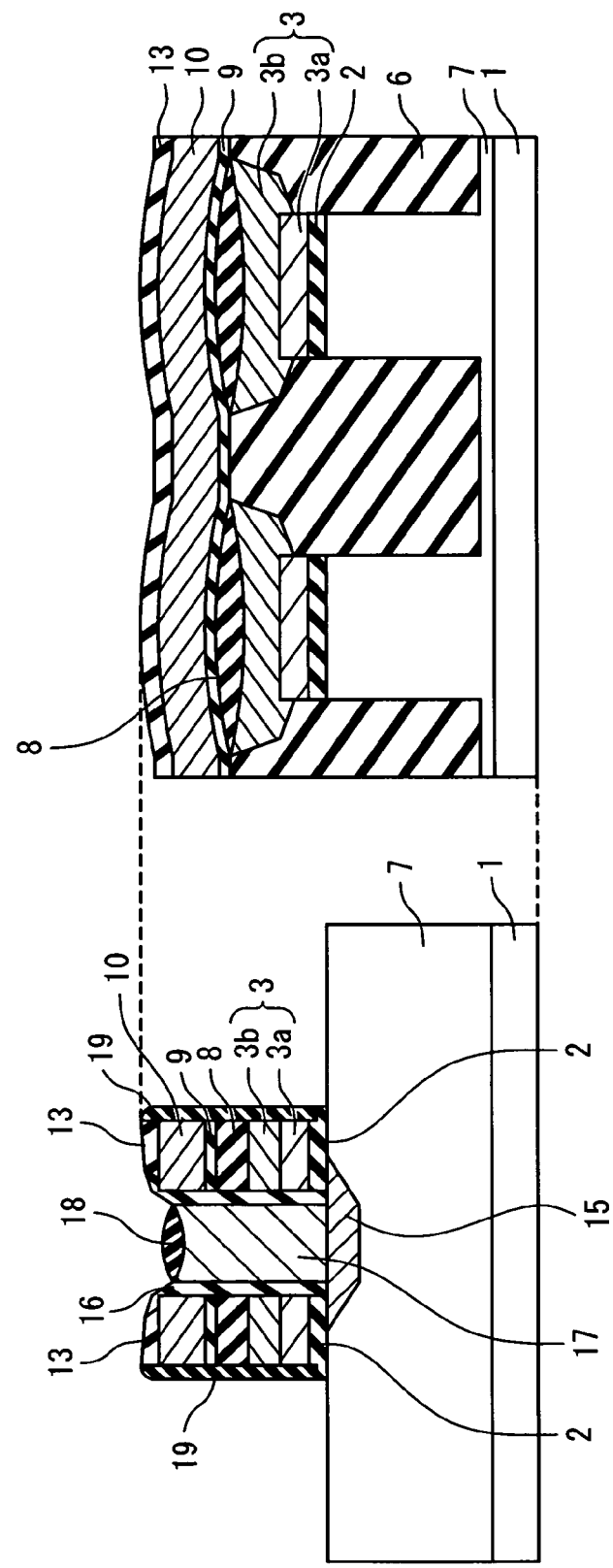

Next, an oxide film having a thickness of about 20 to 30 nm is blanket formed, and then an anisotropic dry etching is performed. Consequently, as shown in FIG. 40, a third oxide film sidewall spacer 19 is formed on side surfaces of the first oxide film sidewall spacer 13, the erase gate 10, the tunnel oxide film 9, the oxide film 8, the floating gate 3 and the first gate oxide film 2. The above-mentioned exposed first gate oxide film 2 having a thickness of about 5 nm is removed by this dry etching. Furthermore, the first oxide film sidewall spacer 13 becomes thinner due to this dry etching.

Figure 41:
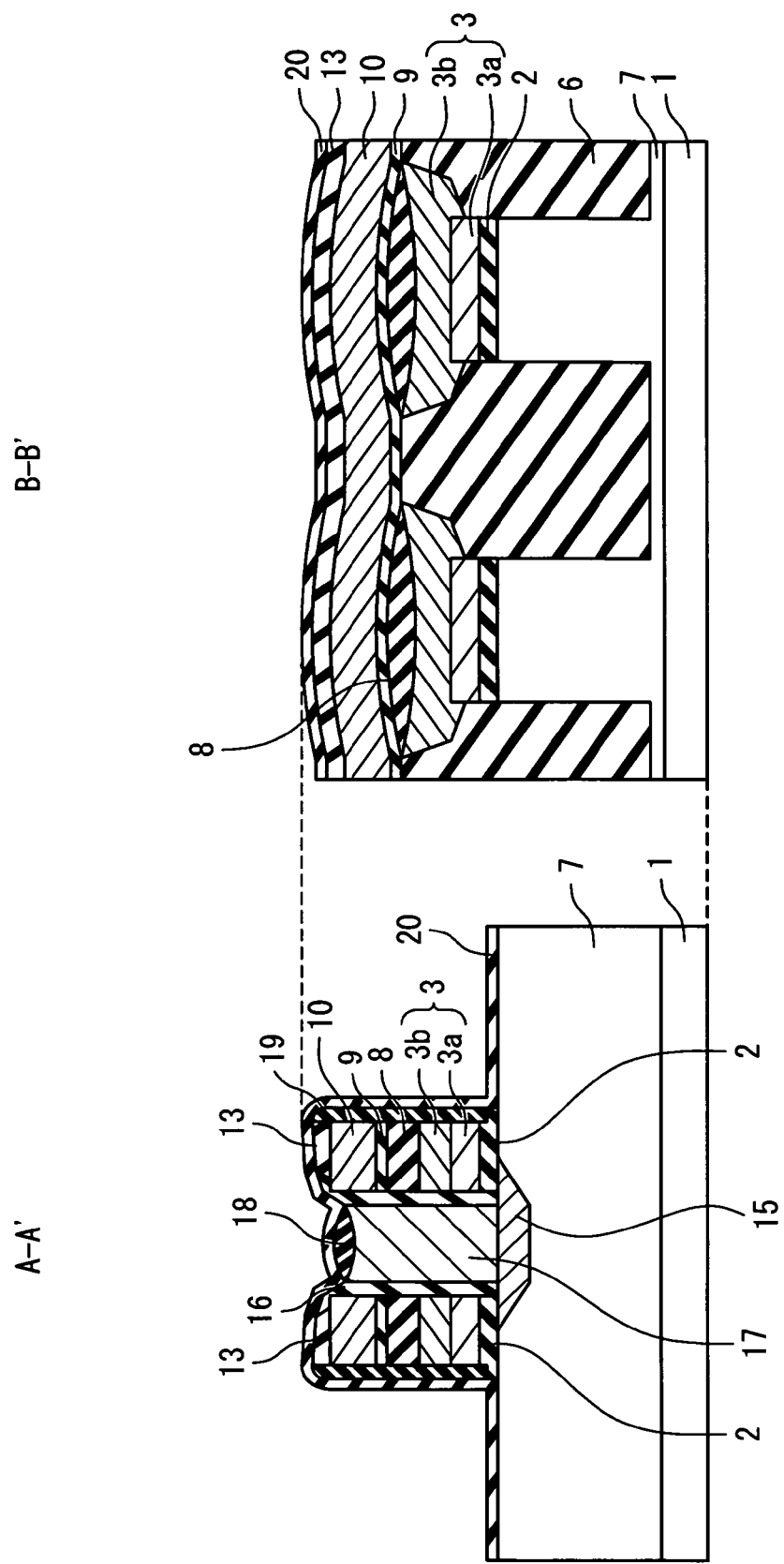

Next, as shown in FIG. 41, a second gate oxide film 20 having a thickness of about 5 to 7 nm is blanket deposited by the CVD method. At this time, the second gate oxide film 20 is formed not only on an exposed region of the silicon substrate 1 (P-well 7) but also on a side wall of the third oxide film sidewall spacer 19. Therefore, two-layer oxide films (the third oxide film sidewall spacer 19 and the second gate oxide film 20) are formed on side walls of the first oxide film sidewall spacer 13, the erase gate 10, the tunnel oxide film 9, the oxide film 8, the floating gate 3 and the first gate oxide film 2. Subsequently, annealing processing may be performed in oxygen or nitrogen atmosphere, or mixed atmosphere of oxygen and nitrogen at about 1000° C. Alternatively, the second gate oxide film 20 may be formed by performing a thermal oxidation at 800 to 900° C.

Figure 42:
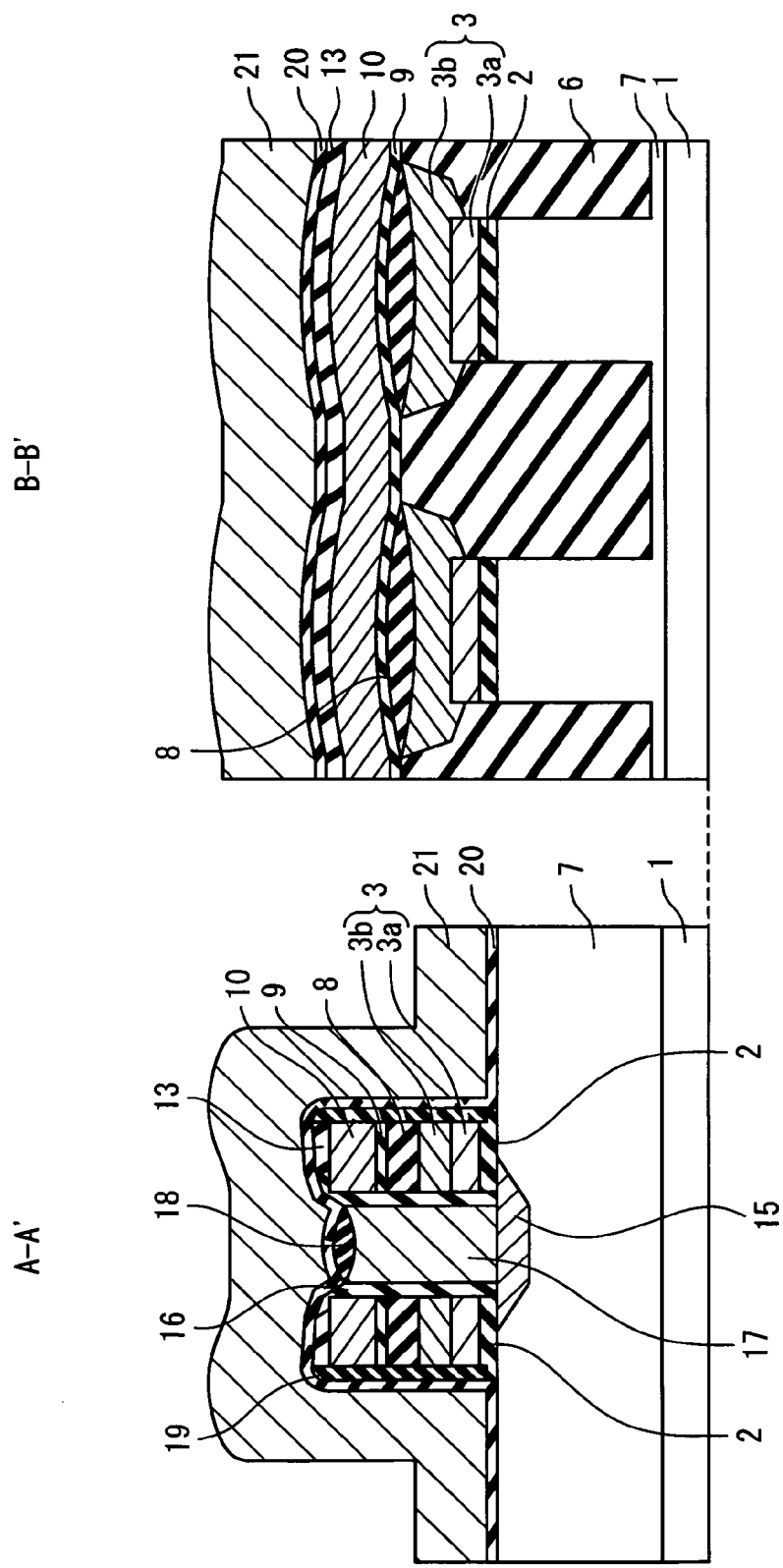

Next, as shown in FIG. 42, a phosphorus-doped fifth polysilicon film 21 having a thickness of about 200 to 300 nm is blanket deposited by the CVD method. The fifth polysilicon film 21 is a material film for the control gate 22.

Figure 43:
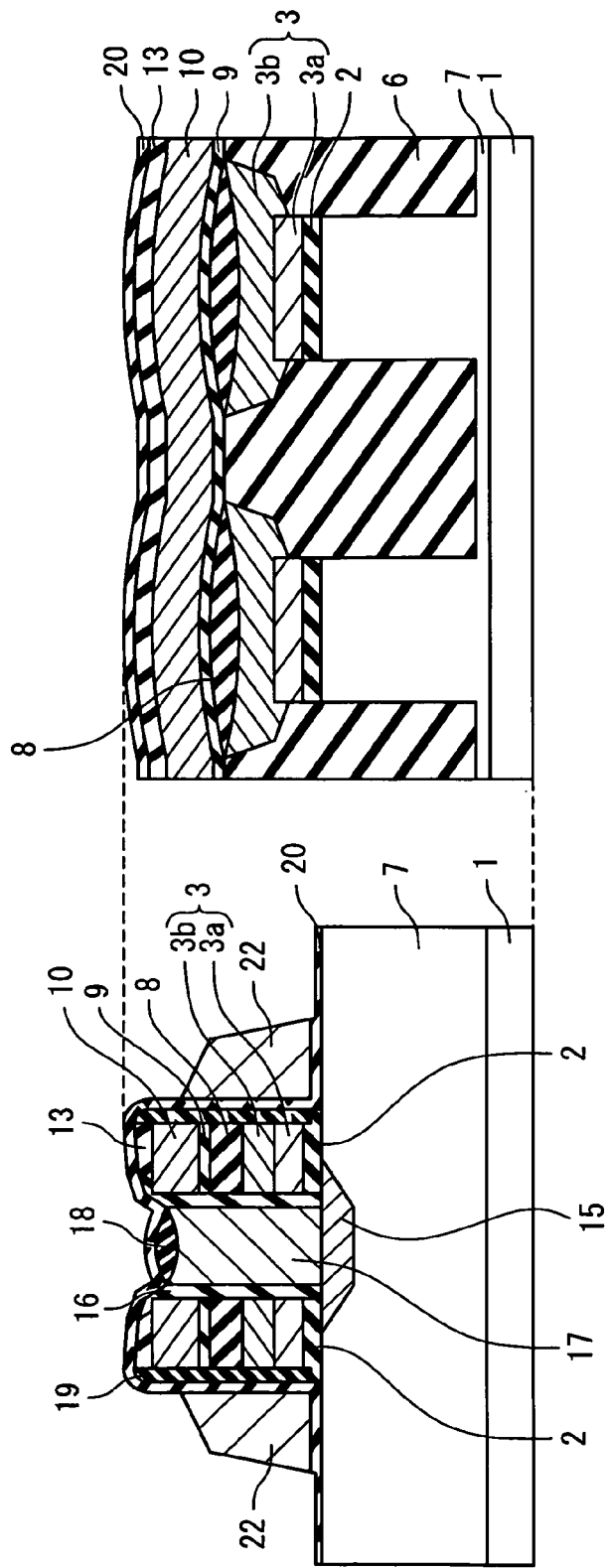

Next, as shown in FIG. 43, the fifth polysilicon film 21 is etched-back and thereby the control gate 22 is formed. The control gate 22 is formed on the silicon substrate 1 (P-well 7) through the second gate oxide film 20. Also, the control gate 22 is formed lateral to the erase gate 10, the tunnel oxide film 9, the oxide film 8, the floating gate 3 and the first gate oxide film 2 across the third oxide film sidewall spacer 19 and the second gate oxide film 20. That is to say, the floating gate 3 and the control gate 22 are formed side by side on the silicon substrate 1. In the present process, the second gate oxide film 20 having a thickness of about 2 to 4 nm remains on the silicon substrate 1 (P-well 7) adjacent to the control gate 22.

Figure 44:
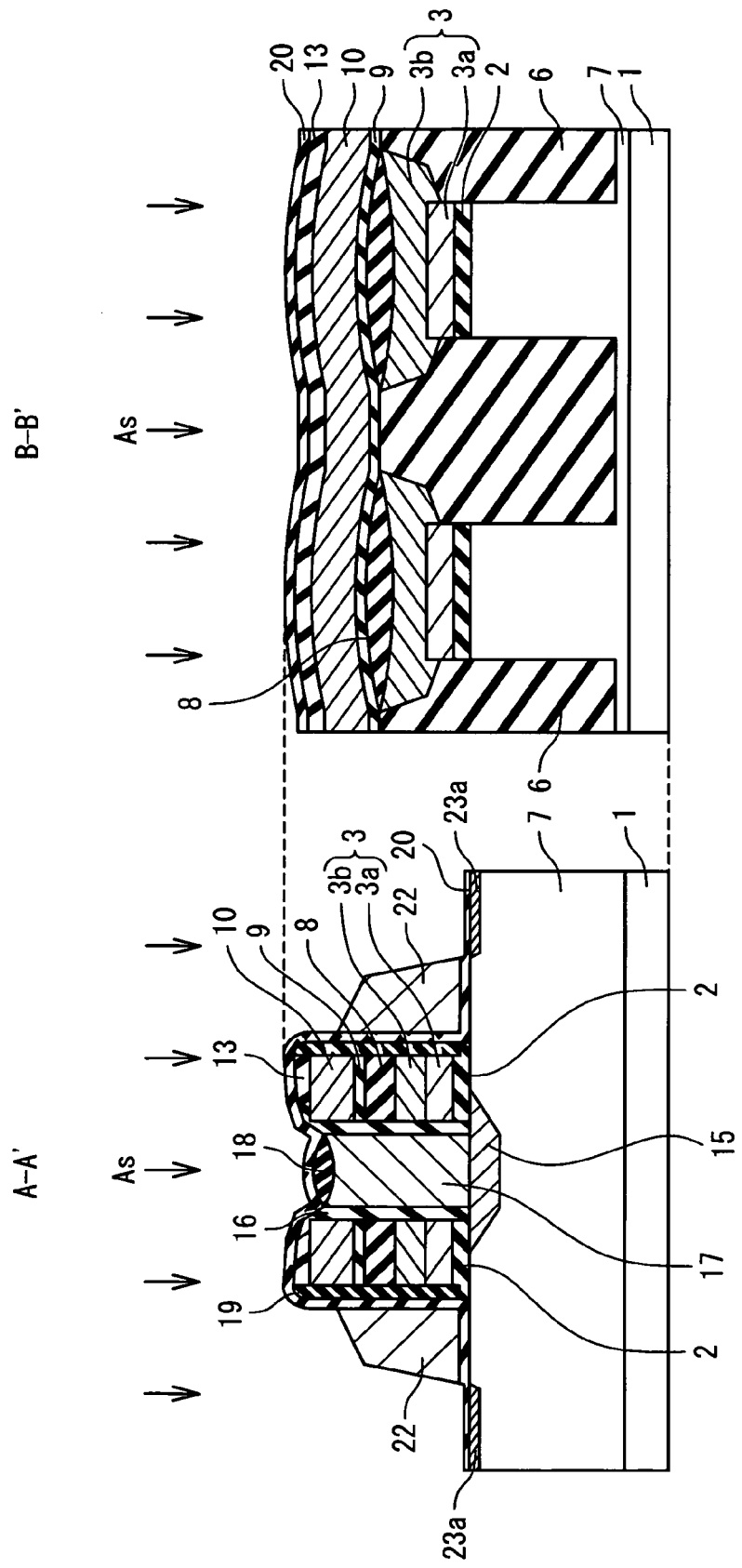

Next, as shown in FIG. 44, N-type impurities (e.g. arsenic (As), injection energy: 10 to 20 keV, dose amount: $1.0 \times 10^{13}$ $cm^{-2}$) are ion injected. After that, for activation, a heat treatment is performed in nitrogen atmosphere of about 1000° C. As a result, a low concentration diffusion layer 23a is formed in the silicon substrate 1 (P-well 7) under the above-mentioned remaining second gate oxide film 20.

Figure 45:
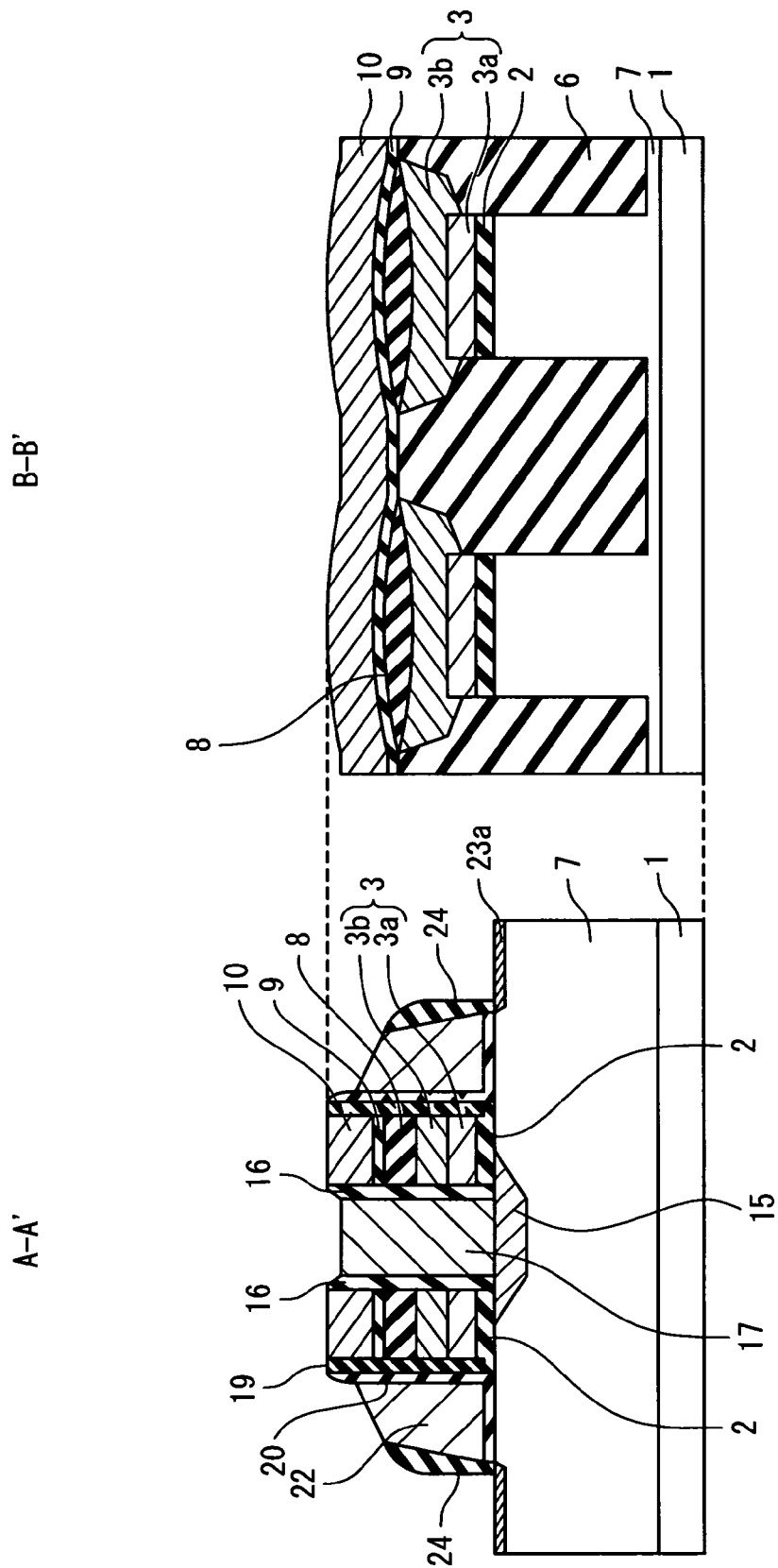

Next, an oxide film having a thickness of about 80 to 100 nm is formed by the CVD method, and then an etch-back is performed. Consequently, as shown in FIG. 45, a fourth oxide film sidewall spacer 24 is formed on a side wall of the control gate 22. In this etch-back, the second gate oxide film 20 on the low concentration diffusion layer 23a, the oxide films (the first oxide film sidewall spacer 13 and the second gate oxide film 20) on the erase gate 10, and the oxide films (the plug oxide film 18 and the second gate oxide film 20) on the plug 17 are removed simultaneously.

Figure 46:
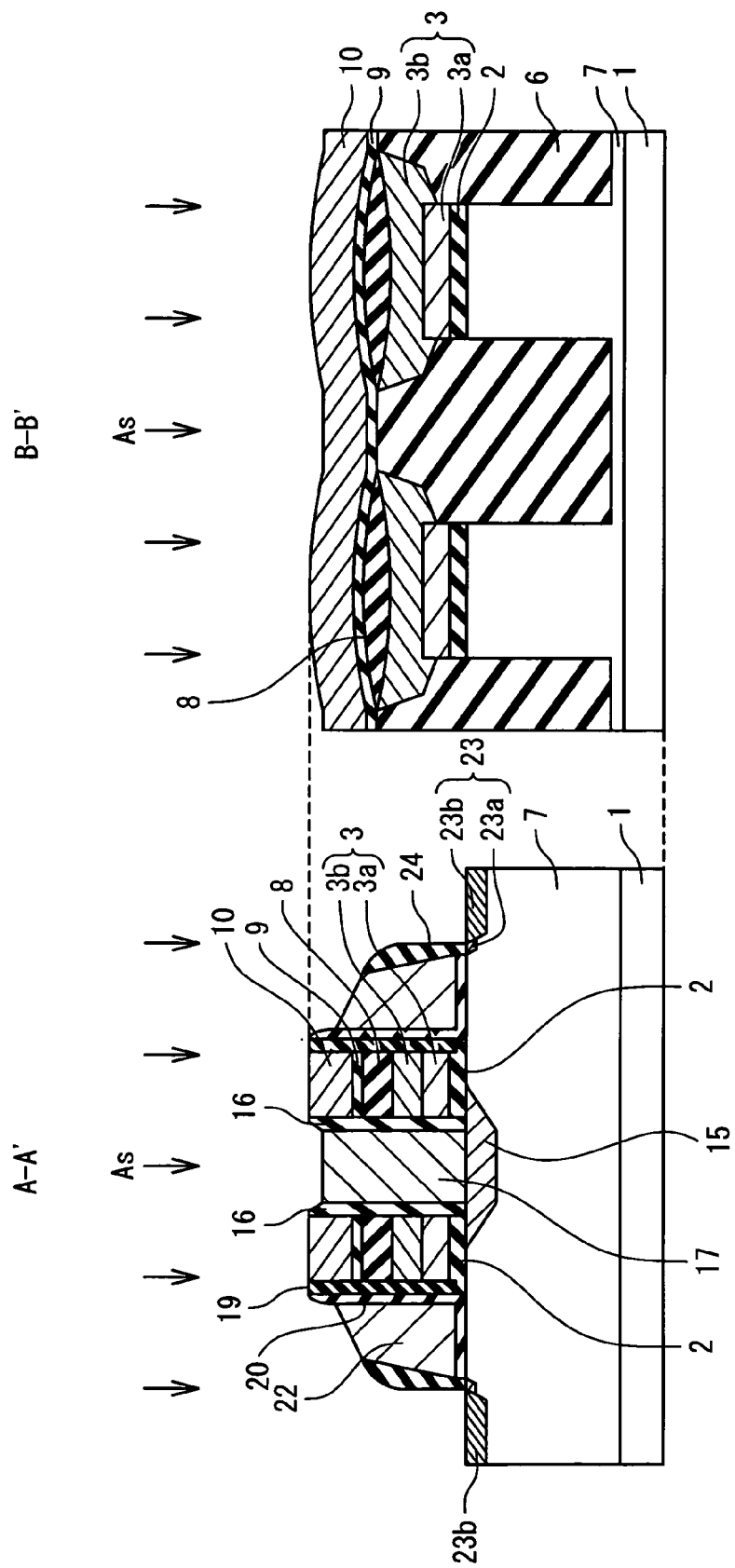

Next, as shown in FIG. 46, N-type impurities (e.g. arsenic (As), injection energy: 30 to 60 keV, dose amount: $3.0 \times 10^{15}$ $cm^{-2}$ to $5.0 \times 10^{15}$ $cm^{-2}$) are ion injected. After that, for activation, a heat treatment is performed in nitrogen atmosphere of about 1000° C. As a result, a high concentration diffusion layer 23b is formed in the silicon substrate 1 (P-well 7). The high concentration diffusion layer 23b is formed in a region adjacent to the fourth oxide film sidewall spacer 24 and the low concentration diffusion layer 23a. In this manner, the second source/drain diffusion layer 23 having an LDD structure is formed.

Figure 47:
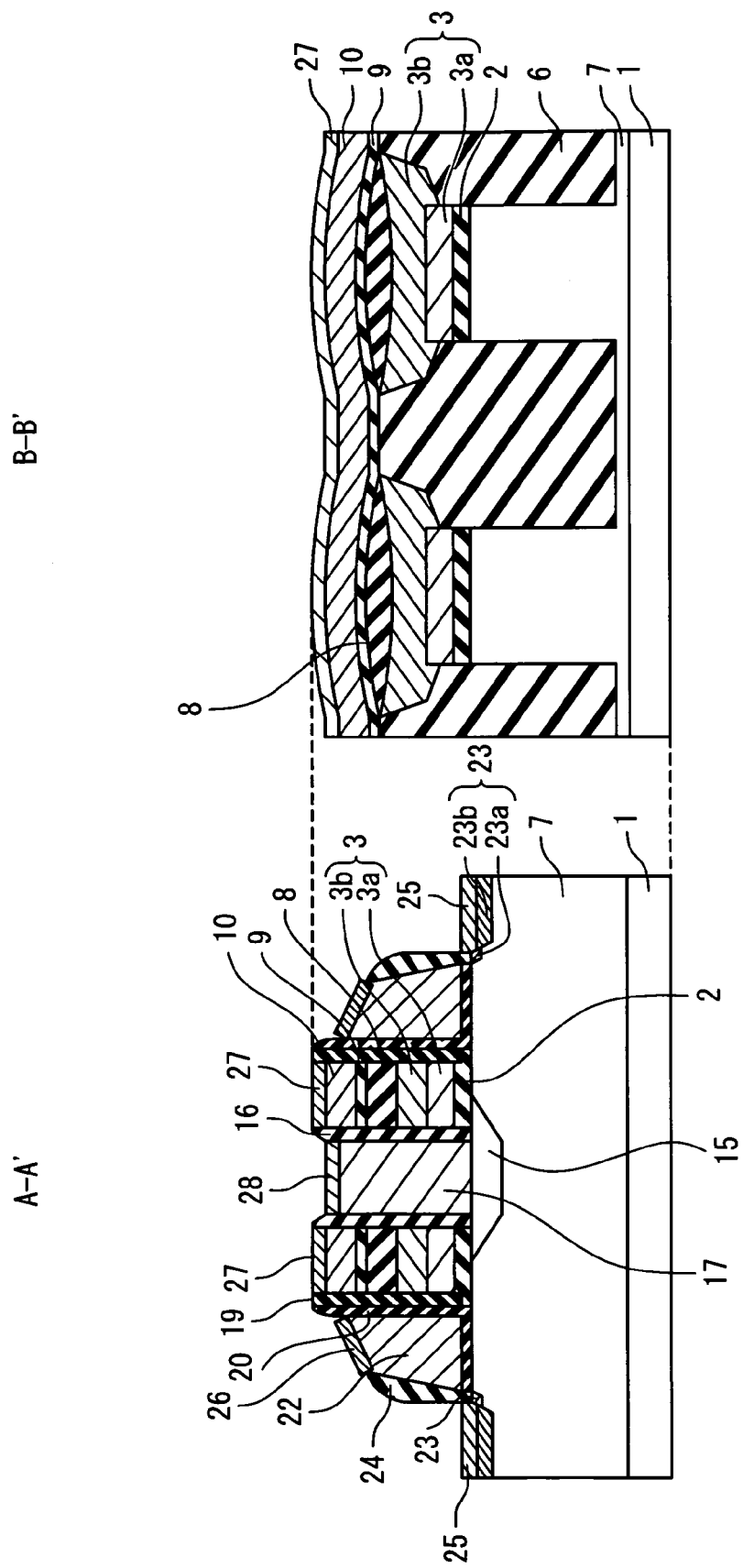

Next, a metal film used for forming silicide, for example, a cobalt film having a thickness of about 30 to 40 nm is blanket formed by a sputtering method. Subsequently, silicidation is performed by a rabbit thermal annealing (RTA) method. After that, unreacted cobalt film on the oxide films (the second oxide film sidewall spacer 16, the third oxide film sidewall spacer 19, the second gate oxide film 20 and the fourth oxide film sidewall spacer 24) is removed. As a result, as shown in FIG. 47, cobalt silicide ($CoSi_2$) films 25 to 28 are formed on the second source/drain diffusion layer 23, the control gate 22, the erase gate 10 and the plug 17, respectively. It should be noted that in the present process, the cobalt silicide films 25 to 28 are formed selectively and in a self-aligned manner. Since upper surfaces of the plug 17 connected to the first source/drain diffusion layer 15, the second source/drain diffusion layer 23, the control gate 22 and the erase gate 10 are all silicided, an interconnection resistance is sufficiently reduced.

Figure 48:
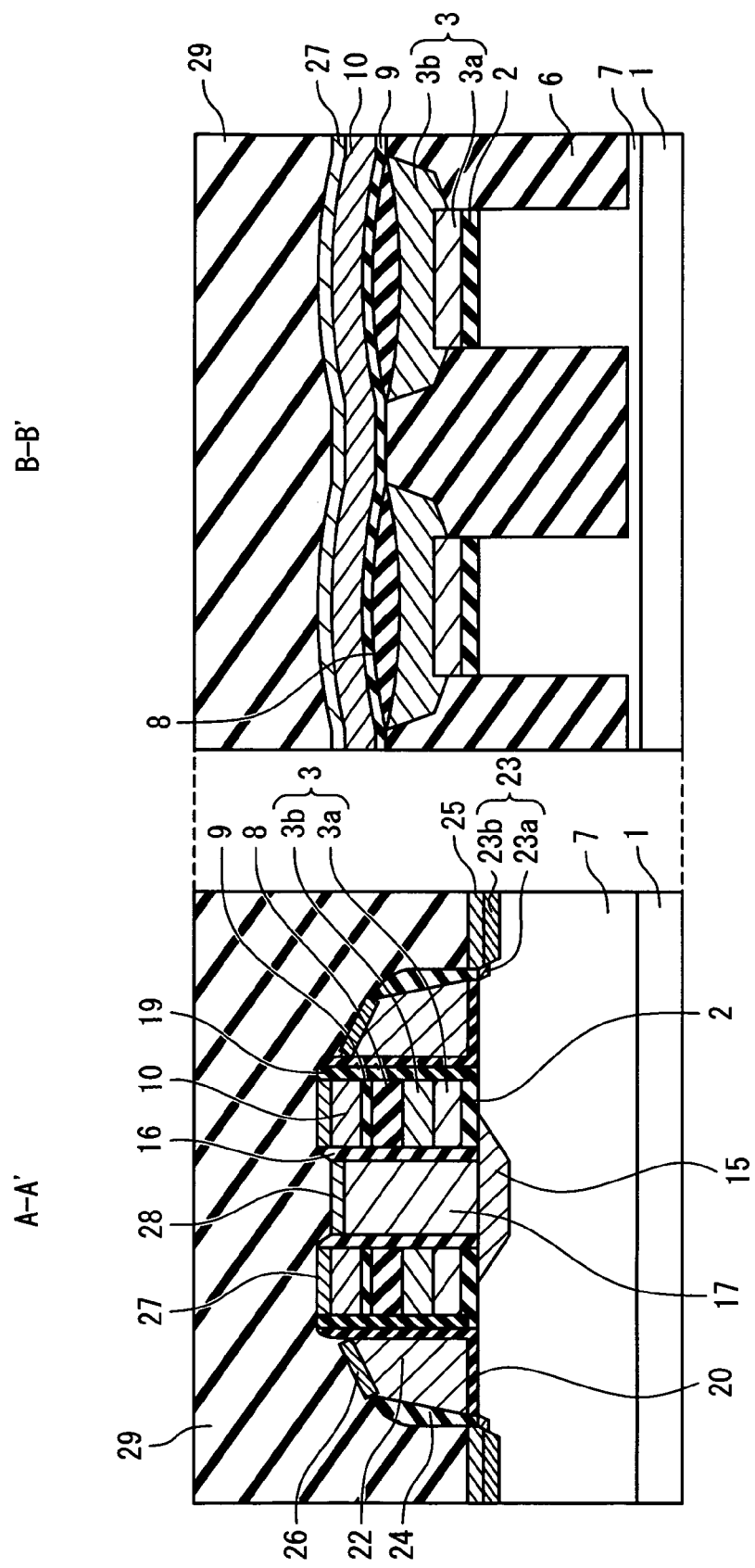

Next, as shown in FIG. 48, an interlayer insulating film (BPSG film, PSG film) 29 is blanket formed and then planarization is performed by the CMP.

Figure 49:
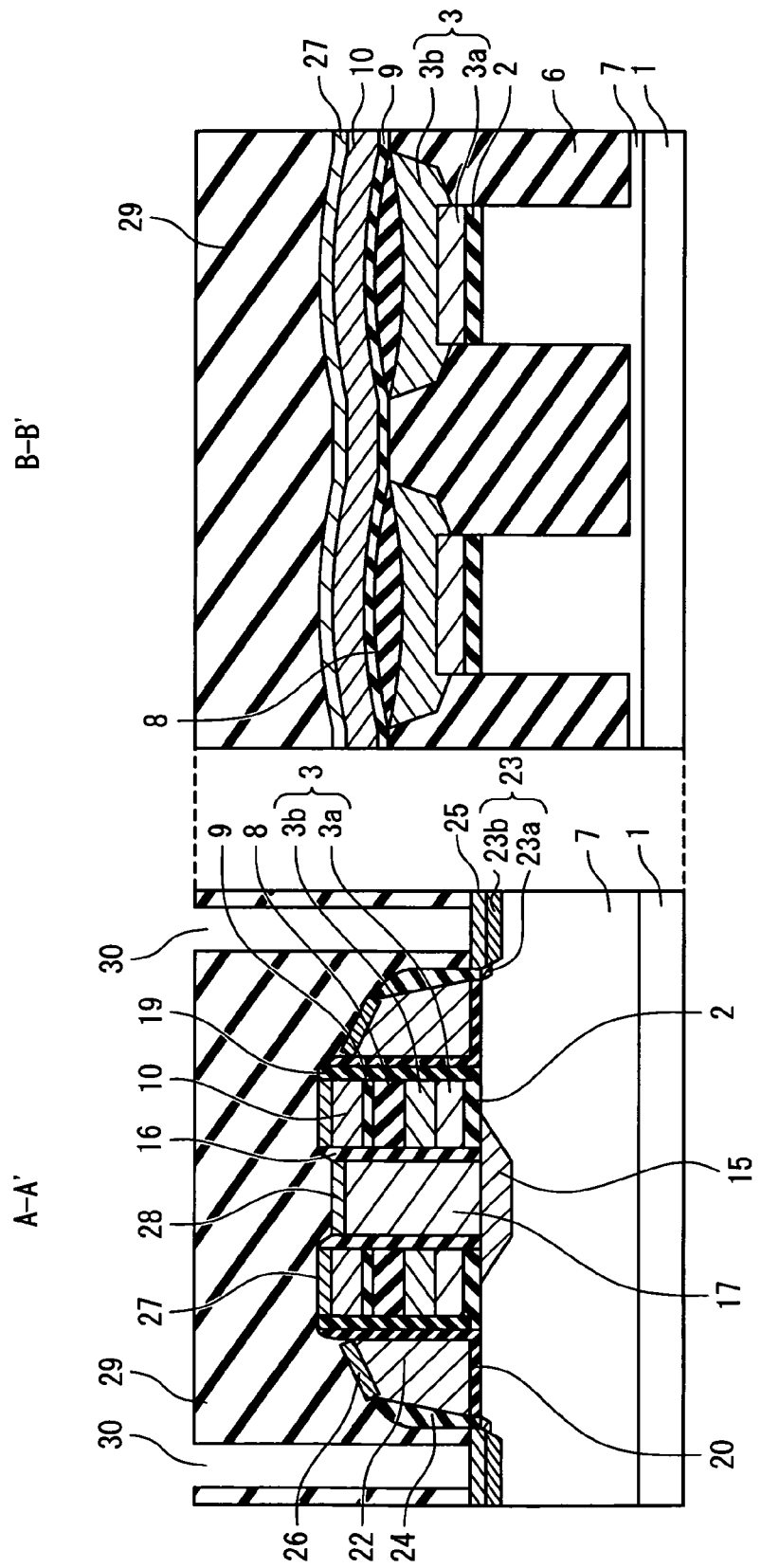

Next, as shown in FIG. 49, a contact hole 30 reaching the cobalt silicide film 25 on the second source/drain diffusion layer 23 is formed by photolithography and dry etching. At this time, a contact hole on the control gate 22, a contact hole on the erase gate 10 and a contact hole on the plug 17 (not shown) are formed simultaneously.

After that, a barrier metal film (for example, a laminate film of a titan film and a titan nitride film) and a contact plug 31 (for example, a tungsten film) are formed in the contact hole 30. Then, a metal film (Al, Cu, Al—Si, Al—Cu, Al—Si—Cu or the like) is formed on the contact plug 31, and a desired patterning thereof is performed to form the metal interconnection layer (Bit-Line) 32.

In this manner, the nonvolatile semiconductor memory device shown in FIGS. 5 to 7 is completed. According to the above-described manufacturing process, use of the lithography technique is minimized as possible, and most members such as the floating gate 3, the control gate 22, the erase gate 10, the first source/drain diffusion layer 15 (plug 17) and the second source/drain diffusion layer 23 are formed in a self-aligned manner. Since the use of the photolithography technique is reduced, manufacturing is simplified and further a size of the memory cell can be reduced.

It is apparent that the present invention is not limited to the above embodiments and may be modified and changed without departing from the scope and spirit of the invention.

What is claimed is:

1. A nonvolatile semiconductor memory device comprising:
    a semiconductor substrate;
    a control gate and a floating gate that are formed side by side on a gate insulating film on a channel region in said semiconductor substrate;
    an erase gate facing an upper surface of said floating gate;
    a first device isolation structure having a first projecting portion that projects from said semiconductor substrate; and
    a second device isolation structure having a second projecting portion that projects from said semiconductor substrate,
    wherein said first projecting portion has a first sloping surface connecting between an upper surface and a side surface of said first device isolation structure,
    said second projecting portion has a second sloping surface connecting between an upper surface and a side surface of said second device isolation structure,
    said first sloping surface and said second sloping surface face each other,
    an interval between said first sloping surface and said second sloping surface becomes larger away from said semiconductor substrate,
    said floating gate is sandwiched between said first projecting portion and said second projecting portion, and at least has a portion located on said semiconductor substrate side of said first sloping surface and said second sloping surface.

2. The nonvolatile semiconductor memory device according to claim 1,
    wherein said floating gate comprises:
    a first conductive film formed on said semiconductor substrate through said gate insulating film; and
    a second conductive film formed on said first conductive film,
    wherein a bottom surface of said first conductive film is located on said semiconductor substrate side of said first sloping surface and said second sloping surface.

3. The nonvolatile semiconductor memory device according to claim 1,
    wherein side surfaces of said floating gate include a first side surface and a second side surface that are respectively in contact with said first sloping surface and said second sloping surface,
    said upper surface of said floating gate is connected to said first side surface at a first side and to said second side surface at a second side, and
    said first side and said second side are located above said upper surface between said first side and said second side.

4. The nonvolatile semiconductor memory device according to claim 3,
    wherein said floating gate comprises two acute-angled portions formed by said upper surface and said first side surface and said second side surface, respectively, and
    electrons in said floating gate are extracted to said erase gate through said two acute-angled portions.

5. A nonvolatile semiconductor memory device comprising:
    a semiconductor substrate;
    a device isolation structure having a projecting portion that projects from said semiconductor substrate;
    a control gate and a floating gate that are formed side by side on a gate insulating film on a channel region in said semiconductor substrate; and
    an erase gate facing an upper surface of said floating gate,
    wherein said projecting portion has a sloping surface connecting between an upper surface and a side surface of said device isolation structure,
    a side surface of said floating gate is in contact with said sloping surface,
    a width of a bottom surface of said floating gate is smaller than a width of said upper surface of said floating gate, and
    said floating gate at least has a portion located on said semiconductor substrate side of said sloping surface.

6. The nonvolatile semiconductor memory device according to claim 5,
    wherein said sloping surface of said projecting portion and said side surface of said floating gate are curved.

7. The nonvolatile semiconductor memory device according to claim 5,
    wherein said floating gate comprises an acute-angled portion formed by said upper surface and said side surface, and
    electrons in said floating gate are extracted to said erase gate through said acute-angled portion.

* * * * *